US007812547B2

(12) United States Patent
Jaan

(10) Patent No.: US 7,812,547 B2
(45) Date of Patent: Oct. 12, 2010

(54) SYSTEMS AND METHODS FOR ORNAMENTAL VARIABLE INTENSITY LIGHTING DISPLAYS

(76) Inventor: Albert Jaan, 4535 10th St., Long Beach, CA (US) 90804

( * ) Notice: Subject to any disclaimer, the term of this patent is extended or adjusted under 35 U.S.C. 154(b) by 821 days.

(21) Appl. No.: 11/695,590

(22) Filed: Apr. 2, 2007

(65) Prior Publication Data

US 2008/0238345 A1 Oct. 2, 2008

(51) Int. Cl.
*H05B 37/00* (2006.01)
*H05K 7/14* (2006.01)

(52) U.S. Cl. .................... 315/291; 315/185 R; 361/752

(58) Field of Classification Search ............. 315/185 R, 315/192, 195, 241 S, 291, 307; 362/249, 362/251, 351, 800; 361/752, 796
See application file for complete search history.

(56) References Cited

U.S. PATENT DOCUMENTS 4,203,091 A 5/1980 Kruskopf
4,570,924 A 2/1986 Connelly
4,890,093 A 12/1989 Allison et al.
5,041,952 A 8/1991 Janda et al.
5,570,000 A 10/1996 Kowalski
5,834,901 A 11/1998 Shen
5,894,201 A 4/1999 Wong
5,969,479 A 10/1999 Wong
6,164,792 A 12/2000 Nakagome
6,388,878 B1 * 5/2002 Chang .................. 361/679.48
6,433,483 B1 * 8/2002 Michael et al. ............... 315/76
6,461,015 B1 10/2002 Welch
6,588,913 B1 7/2003 Huang
6,765,149 B1 * 7/2004 Ku ............................. 174/66
6,851,208 B2 2/2005 Carter
6,888,727 B2 * 5/2005 Chang ........................ 361/752
6,994,448 B1 2/2006 Gorrell
7,029,140 B2 4/2006 Wong et al.
7,129,654 B2 10/2006 Tsai et al.
7,163,324 B2 1/2007 Pederson
7,212,932 B1 5/2007 Taylor
7,336,157 B2 * 2/2008 Richmond ................. 340/326
2003/0121541 A1 7/2003 Hilton et al.
2004/0105256 A1 6/2004 Jones
2005/0248285 A1 11/2005 Richmond
2006/0227542 A1 10/2006 Richmond

* cited by examiner

*Primary Examiner*—Douglas W Owens
*Assistant Examiner*—Jimmy T Vu
(74) *Attorney, Agent, or Firm*—Knobbe Martens Olson & Bear, LLP

(57) ABSTRACT

A device and method for illuminating an electrically powered decorative lighting system with a plurality of individual light elements that can be positioned in or on surrounding plants, windows, or other display areas to simulate fireflies. The plurality of light emitting elements, such as LEDs or fiber optic cables, are arrangable with mounting devices or can be suspended or attached to any surrounding structure to provide an ornamental lighting effects. Electrical power is provided with rechargeable batteries charged with a solar panel. One preferred embodiment uses insulation-displacement connectors and an insulation-displacement connector ribbon cable to attach the light emitters to a microprocessor control which creates unique and varied timing patterns for the various light emitters to simulate fireflies.

30 Claims, 17 Drawing Sheets

SYSTEMS AND METHODS FOR ORNAMENTAL VARIABLE INTENSITY LIGHTING DISPLAYS

BACKGROUND OF THE INVENTION

1. Field of the Invention

The invention relates generally to the field of ornamental lighting systems, and more specifically to improvements in outdoor decorative landscaping as well as indoor flashing lighting systems with a plurality of lights simulating fireflies, twinkling stars, and other variable lighting pattern displays.

2. Description of the Related Art

Certain lighting systems using wired bulbs, light emitting diodes (LED) and fiber optics to produce ornamental or functional visual effects are known in the art. These lighting systems may be used indoors and outdoors for commercial or personal use in signs, scrolling billboards, and with Christmas, Halloween or other holiday lighting displays. Lighting systems may be used to produce light in varying colors and may provide consistent light, flashing or strobe light effects or patterns. It is also known to use alternating current (AC) or direct current (DC) to provide power to lighting systems, batteries to store energy, and solar panels in conjunction with rechargeable batteries or photovoltaic switches to convert ambient solar or indoor light into energy that can be stored and used to power the lighting systems. Certain lighting systems may use circuitry and/or microprocessors to control display timing and patterns using switches, diodes, gates, and other electronic components.

Specific lighting systems disclosing varying methods and devices for creating flashing displays are known in the art, including systems providing flashing lights or safety and ornamental lighting to clothing and accessories as disclosed in U.S. Pat. Nos. 5,969,479, 7,029,140 and 7,129,654. Lighting systems attempting to simulate fireflies are also known in the art, with examples such as is described in U.S. Pat. Nos. 4,570,924 and 6,851,208 and with such commercial products as sold by Firefly Magic, Creativations Fireflies, and Twilight Lights. However, some of the above mentioned lighting systems and other existing lighting systems known in the art have a number of disadvantages in producing variable intensity lighting displays. In particular, existing systems tend to use binary flashing patterns which are either on or off, and do not vary in intensity in a manner similar to how real fireflies display light.

SUMMARY OF THE INVENTION

Accordingly, there is a need for apparatus, systems, and methods that can more cost-effectively produce reliable, realistic variable intensity lighting displays. There is provided in accordance with one embodiment of the present invention an improved lighting display system including a power source, an insulation-displacement connector (IDC), an insulation-displacement connector cable (IDC cable), and at least one light emitter disposed at a distal end of the IDC cable. The IDC is electrically connectable to the power source. The IDC cable is electrically connected to the IDC, and the IDC cable includes a plurality of wires having a distal end. At least one light emitter is disposed at the distal end of each of the wires, with each of the light emitters being electrically connected to the IDC cable.

In one embodiment of the present invention, an improved lighting display system includes a power source, a controller circuit, at least one elongate transmission member with a proximal end and a distal end, and at least one light emitter. The controller circuit is electrically connected to the power source. The proximal end of the at least one elongate transmission member is electrically connected to the controller circuit. The at least one light emitter is electrically connected to the distal end of the elongate transmission member. The at least one light emitter is configured to illuminate in a lighting pattern. The lighting pattern is controlled by the controller circuit so that the lighting pattern varies in brightness over time, where the lighting pattern varies in brightness at one or more pre-determined rates for one or more durations of time.

In another embodiment of the present invention, an improved lighting display system includes a power source, a controller circuit, an insulation-displacement connector cable (IDC cable), and at least one LED. The power source includes a rechargeable battery electrically connected to a solar panel. The controller circuit is electrically connected to the power source, and the controller circuit includes at least one microcontroller unit. The IDC cable is electrically connected to the controller circuit. The IDC cable has a distal end. The at least one LED is electrically connected to the distal end of the IDC cable. The LED is configured to illuminate in at least one lighting pattern controlled by the controller circuit. The lighting pattern ramps upward in brightness at a first upward ramp rate from a non-illuminated level to a maximum-brightness level in a first duration. Then the lighting pattern ramps downward in brightness at a first downward ramp rate from the maximum-brightness level to the non-illuminated level in a second duration. Then the lighting pattern ramps upward in brightness at the first upward ramp rate from the non-illuminated level to the maximum-brightness level in the first duration. Then the lighting pattern ramps downward in brightness at the first downward ramp rate from the maximum-brightness level to the non-illuminated level to in the second duration. Then the lighting pattern ramps upward in brightness at the first upward ramp rate from the non-illuminated level to the maximum-brightness level in the first duration. Then the lighting pattern ramps downward in brightness at the first downward ramp rate from the maximum-brightness level to the non-illuminated level to in the second duration. Then the lighting pattern is followed by a randomly determined duration of non-illumination followed by a second lighting pattern.

In yet another embodiment of the present invention, a method of illuminating a light with a lighting display system includes providing an improved lighting display system and programming a controller circuit in the improved lighting display system to direct an average current to vary a lighting pattern brightness of at least one light emitter over time. The improved lighting display system includes a power source, a controller circuit, at least one elongate transmission member, and the at least one light emitter. The controller circuit is electrically connected to the power source. The at least one elongate transmission member has a proximal end and a distal end. The proximal end of the at least one elongate transmission member is electrically connected to the controller circuit. The at least one light emitter is electrically connected to the distal end of the elongate transmission member. The at least one light emitter is configured to illuminate in a lighting pattern. The programming of the controller circuit to direct an average current to vary the lighting pattern brightness of the at least one light emitter over time includes a step in which the at least one light emitter will ramp up in brightness at a pre-determined finite rate.

BRIEF DESCRIPTION OF THE DRAWINGS

These and other features, embodiments, and advantages of the present invention will now be described in connection with preferred embodiments of the invention, in reference to the accompanying drawings. The illustrated embodiments, however, are merely examples and are not intended to limit the invention.

Figure 1:
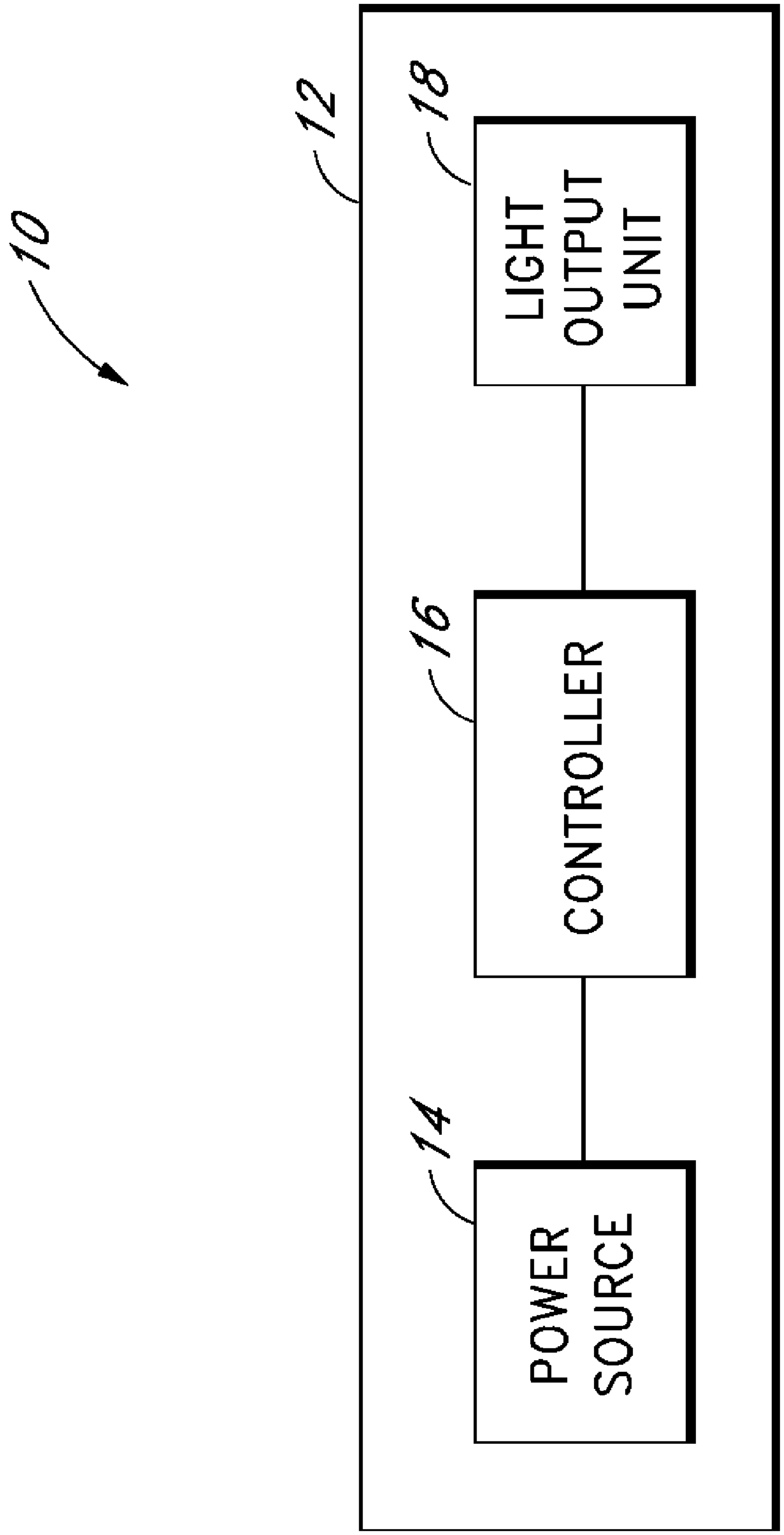
FIG. 1 is a schematic block diagram of a lighting system according to one embodiment of the present invention.

Throughout the figures, the same reference numerals and characters, unless otherwise stated, are used to denote like features, elements, components or portions of the illustrated embodiments. In certain instances, similar names may be used to describe similar components with different reference numerals which have certain common or similar features. Moreover, while the subject invention will now be described in detail with reference to the figures, it is done so in connection with the illustrative embodiments. It is intended that changes and modifications can be made to the described embodiments without departing from the true scope and spirit of the subject invention as defined by the appended claims.

DETAILED DESCRIPTION OF THE PREFERRED EMBODIMENT

As should be understood in view of the following detailed description, this application is primarily directed to apparatuses, systems and methods for producing lighting displays. The apparatuses and systems described herein can be configured to provide a variety of ornamental, functional, static, or dynamic lighting displays for numerous applications and lighting locations. Certain embodiments may be used outdoors or indoors, with landscaping in the midst of plants such as dangling from bushes or trees or arranged in the midst of bouquets and flower arrangements. Various embodiments may be fastened to wires, attached to a mesh, configured to be portable or hand-held, or worn. Some embodiments may be worn or arranged with clothing or accessories, such as in a dress, tiara, halo, hat, hair accessory, belt, pins, shirt, vest, cape, costume or many other arrangements. Some embodiments may be used in greeting cards, books, toys, food, pastries, wedding cakes, birthday cakes, art work and ice sculptures. Various embodiments may be used in garden displays, theme parks, store displays, homes, boats, vehicles, commercial establishments, parks, ponds, swimming pools, and many other applications. Some embodiments may be combined with sound emitting devices, such as music or sound patterns that can be coordinated with the lighting displays. There are many other possible applications which will not be described expressly herein but in which the novel lighting system described herein may be employed.

A preferred embodiment of the invention is an electrically powered decorative lighting system with a plurality of individual light elements that can be positioned in or on surrounding plants, windows, or other display areas to simulate fireflies. Each light element can simulate a single firefly. In a landscaping context, the lighting system can be placed or mounted on or near a shrub, tree, plant, pond, swimming pool with each of the plurality of light elements, such as LEDs, arranged within the branches or among the leaves of a plant, or with mounting devices and suspended or attached to any surrounding structure to provide an ornamental lighting effect that appears to be several fireflies. In particular, the electrical power can be provided with rechargeable batteries that can be charged with a solar panel. One feature of a preferred lighting system is the use of an insulation-displacement connector (IDC) and IDC ribbon cable to attach the LEDs to a microprocessor control housing. Some advantages of the use of an IDC cable is adaptability of wire length for each LED "firefly", flexibility, and low manufacturing and part costs. Another feature of a preferred lighting system is the use of a microprocessor or other control circuit chip to create unique and varied timing patterns for the various LEDs to simulate fireflies.

FIG. 1 illustrates a schematic block diagram of one embodiment of a lighting system 10 according to the present invention which comprises a housing 12, a controller 16, power source 14 and a light output unit 18. The controller 16 is electrically connected to the power source 14 and to the light output unit 18. The housing 12 is sized and configured to hold or contain at least a portion of the controller 16, power source 14 and light output unit 18.

In one embodiment, the housing 12 is configured to provide a substantially water-resistant or weather-proof enclosure for at least a portion of the controller 16, power source 14 and light output unit 18 that is sufficient to prevent damage from the environment from such sources as rain, wind, sprinkler water, or dirt. In one embodiment the housing may be completely water-proof through the use of enclosures or seals or other similar features for placement of the housing of the lighting system in dirt, under water or within frozen water and ice. In various embodiments, the housing may be made of plastic, wood, metal or other materials known in the art, and may be translucent or opaque in any color. Certain housings may be made in a color or exhibit a pattern to help the housing blend in with its location, such as shades of green to blend with plants, or brown, black, grey, or other colors, patterns and combinations thereof such as camouflage. Certain embodiments of the housing may have a port or access channel through which a power cable, solar panel, sensor, control connection, or light output unit connection may be attached or extend there through. The size of various embodiments of the housing may be configured to be portable, placed on a stand, connectable to a plant or other object, and other configurations suitable to use of the device. Various embodiments of a housing are described herein, and each may be similar to other references to housings also mentioned herein. For example, housings 12, 21, 62, 151 and 152 can have features described with any housing herein.

The controller 16 can consist of circuitry, timers, fuses, processors, sensors and other elements that will be described in various embodiments below. The power source 14 may consist of a battery, rechargeable battery, solar cell, direct current or alternating current source, or any other type of power source known in the art. A power source 14 is electrically interconnected to the controller 16 and the light output unit 18 for supplying power thereto. Various embodiments will be described in detail below. The light output unit 18 can consist of any number of systems to place controllable light emitters in, on or at various distances from the housing 12. Some embodiments use light emitting diodes, fiber optics, bulbs, surface mount technology and other light systems known in the art. In certain embodiments of light output units 18 that are configured to simulate fireflies, the light emitter can be set to approximate the light of certain species of fireflies. For example, a light emitting at or near a wavelength of 521 nm-528 nm can be used to approximate the wavelength at which certain fireflies emit light.

Figure 2:
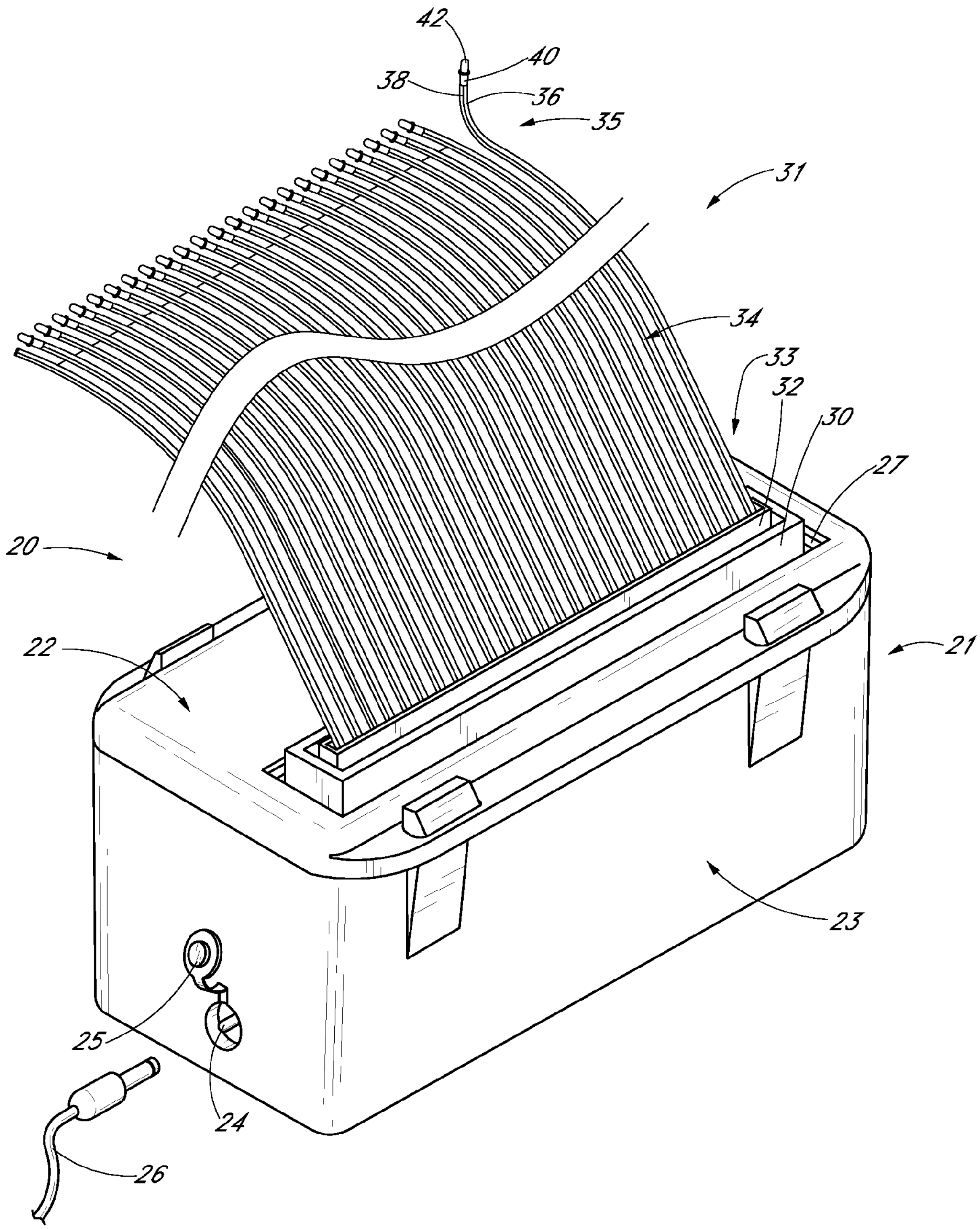
FIG. 2 is a schematic perspective view of a portable lighting system according to one embodiment of the present invention.

FIG. 2 is a schematic perspective view of a portable lighting system 20 according to one embodiment of the present invention. As illustrated, the lighting system 20 comprises a housing 21 and a light output unit 31. The housing 21 comprises a top housing 22 and a bottom housing 23. The top housing 22 and the bottom housing 23 are attachable to form a substantially enclosed housing for containing components of the lighting system 20. As illustrated, the top housing 22 and the bottom housing 23 can be connected by a snap fit in configurations known in the art, or through other means such as fasteners, screws, rivets, bonding, welding and other attachment means. In other embodiments (not illustrated) the housing may be composed of one or more pieces. In one embodiment, the housing 21 has one or more access ports 24 that can optionally have a port cover 25 which seals the port 24 when the port is not in use. A cable 26 is removably connectable to the lighting system 20 through the port 24. In one embodiment the cable 26 can provide power from external sources to light the light system 20. For example, the cable 26 may be connected to a direct current (DC) power source, such as a garden landscaping or vehicle adaptor circuit, a transformer, an alternating current (AC) power source, or some other power source. In another embodiment the cable 26 can provide a communication channel in the form of a data communication line, a phone line, Ethernet cable, USB connection, firewire, external sensor, solenoid, cable, or fiber optic line. In the illustrated embodiment the housing 21 has a light output unit port 27 which provides a channel through which a light output unit 31 may extend through the housing 21. In the embodiment shown the light output unit port 27 provides an interface to which a light output unit 31 is mechanically and electronically connected. The light output unit port 27 and housing 21 can be sealed to prevent water or environmental damage or contamination to the interior of the housing 21 and the components of the lighting system 20 located therein. As illustrated, a dock 30 is disposed in the light output unit port 27 and provides an electrical connection between a proximal portion of the light output unit 31. The dock 30 can provide a seal with the housing 21.

In one embodiment, the light output unit 31 of the lighting system 20 comprises a connector 32, an elongate transmission member 34 and at least one light emitter 42. In some embodiments, the connector 32 connects transmission member to a control circuit, as will be described herein. In one embodiment, the connector 32 is electrically connected to an input current source which drives or powers one or more light sources (not illustrated here, but see FIGS. 18-19 light sources 526, 534 and 554), such as a light bulb, LED, surface mount technology light, surface mount device light, or other light sources known to one skilled in the art. Light emitted from the light source is optically connected to a proximal end 33 of the transmission member 34 and transmitted along the transmission member 34 to a distal end 35 of the transmission member 34 where the light emitter 42 illuminates light which is visible to an observer of the lighting system. In other embodiments, such as the illustrated embodiment, the connector 32 is electrically connected to an input current source which is electrically connected to the proximal end 33 of the transmission member 34 and transmitted along the transmission member 34 to the distal end 35 of the transmission member 34 where the light emitter 42 comprises one or more light sources which illuminate. The light source can be a light bulb, LED, surface mount technology light, surface mount device light, or other light sources known to one skilled in the art.

The elongate transmission member 34 has a proximal end 33 and a distal end 35, wherein the proximal end 33 is electrically, mechanically and/or optically connected to the connector 32 and the distal end 35 is electrically, mechanically and/or optically connected to at least one light emitter 42. In certain embodiments with a plurality of light emitters 42, there can also be a plurality of elongate transmission members 34 to electrically connect the connector 32 with the respective light emitters 42. In certain embodiments, more than one light emitter 42 may be electrically attached to a single elongate transmission member 34.

In the illustrated embodiment, the connector 32 electrically connects the proximal end 33 of the elongate transmission member 34 to a controller (not illustrated). Each of the connector 32, the elongate transmission member 34 and the light emitter 42 may be combinations of multiple components. In some embodiments, the light output unit 31 may be comprised of wires, ribbon cable, fiber optics, connector housings, optical tube interfaces, light bulbs, LED's, surface mount devices (SMD), surface mount technology (SMT), lenses, diffusion tips, and ornamental designs.

Figure 3:
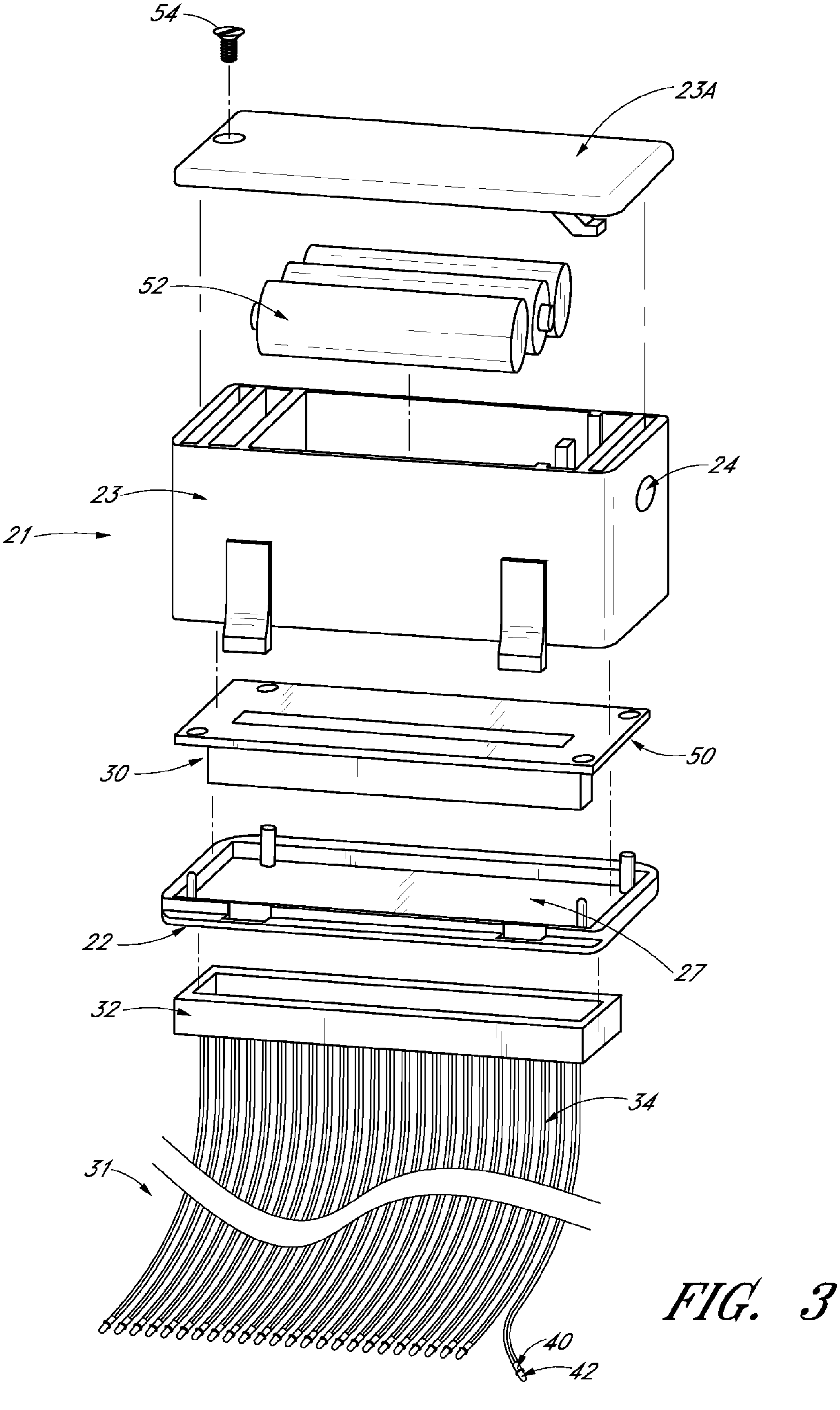
FIG. 3 is an exploded perspective view of part of the lighting system of FIG. 2.
Figure 7:
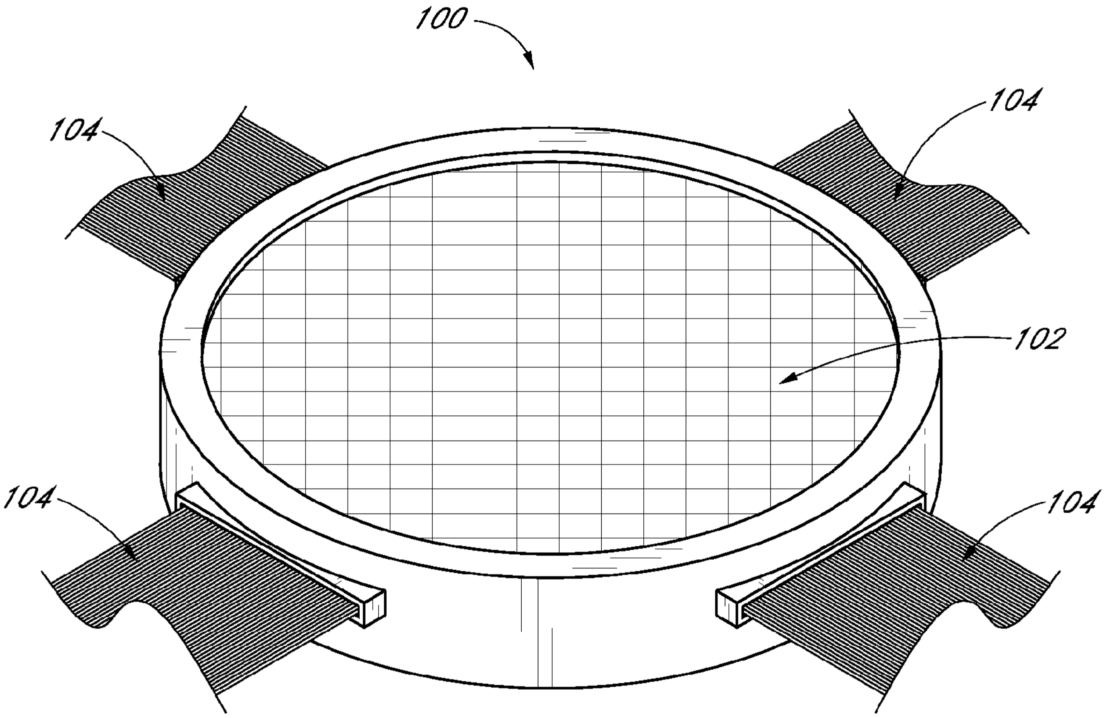
FIG. 7 is a schematic perspective view of a lighting system with a solar panel according to another embodiment of the present invention.

As illustrated in the embodiments in FIGS. 2-3, the lighting output unit 31 comprises twenty-four LEDs. In other embodiments, the unit may comprise twelve LEDs, or any number of LEDs as needed to create a desired visual display. As represented in FIG. 7, many more LEDs can be used in other embodiments. In one embodiment, the LEDs are 3 mm Jiangsu Electric Light LEDs part LAG30243. Many other LEDs are available and known in the art and can be used to emit particular wavelengths of light and color.

In the illustrated embodiment of FIGS. 2 and 3, the connector 32 is an insulation-displacement connector (IDC), also known as an insulation piercing connector, an IDC socket connector, or a ribbon socket, as is known in the art. These connectors work in conjunction with IDC headers to mechanically connect in a manner that provides electrical connection between the individual wires to a power or current source. In some embodiments, a printed circuit board (PCB) transition connector is attached to a PCB to serve as an IDC header. As described herein, the term IDC connector will include both sides of a connection interface—both the socket connector and either the header or PCB transition connector. In one embodiment, a 50-pin IDC is used. For example, an IDC, or ribbon socket with 50 positions manufactured under part number 3M 89150-0101 or FCI 71600-050LF may be used. The 3M 89150-0101 preassembled wiremount socket is a 0.100"×0.100" for 0.050" pitch cable that is RoHS compliant and has a UL 94V-0 rating with UL file No. E68080. In some embodiments, in addition to the ribbon socket, a strain relief may be used with the ribbon socket. Examples of strain reliefs include 3M 3448-89150, or if the ribbon socket FCI 71600-050LF is used, the strain relief is included. Many other connectors are available from the mentioned manufacturers as well as from other manufacturers and can be purchased and used.

In the illustrated embodiment of FIGS. 2 and 3 the plurality of elongate transmission members 34 is an IDC cable, also known as an IDC ribbon cable, IDC flat ribbon cable, ribbon cable and other variations, which can be purchased off the shelf in a configuration with the multiple wires longitudinally connected to each other in a parallel array. In one embodiment, the flat ribbon cable can be approximately ten feet of 1.27 mm (0.50") pitch Assmann AWG28-50/G/300, which has thin stranded copper conductors with a 300V voltage rating, which is RoHS compliant, UL style 2651. In another embodiment, the flat ribbon cable can be approximately 10 feet of 3M 3365/50 (300SF). The use of other flat ribbon cables, manufacturers, thicknesses, pitches, lengths, wire counts, colors and configurations are contemplated. Shorter lengths can be used for smaller displays, and longer lengths can be used for larger displays. A variety of lengths can be provided for a range of display distances. The wires comprise an elongate conductive material housed in an insulating material, such as a metal housed in a plastic material. As illustrated, the IDC cable has 50 parallel wires capable of being laid flat in a plane. Each of the wires can be mechanically or manually stripped or separated from the other wires. Some wires or sets of wires can be pre-stripped or partially stripped. Adjacent pairs of wires, such as wires 36 and 38 may be connected to each other and partially or completely separated from the rest of the wires in the IDC ribbon cable. One of the advantages of using IDC ribbon cable is its relatively low cost and labor savings. For example, the snap fit of an IDC interface with the ribbon wire can save significant costs over soldering the plurality of wires to an interface. The ribbon cable can be provided in any number of lengths, and the lengths of the individual or paired wires can be made adjustable.

The rigidity of the plurality of elongate transmission members 34 can be varied depending on the desired lighting effect. Some embodiments of the elongate transmission members are wires which are relatively flexible and can be resilient enough to return to a relatively straight configuration after being bent. Other wires can be rigid enough to be bent and retain the bent form. For example, a wire can be bent so that a light emitter 42 is held in a certain relative position with respect to the housing. Depending on the rigidity of the wire, wind or motion (such as from a moving part or motor, or the motion of a device in a moving vehicle or on a moving person) may shake the wires, resulting in a light display that appears to be dynamic, or moving. Various structural or aesthetic configurations may be formed using varying rigidities in the wire.

The illustrated embodiment of the light emitter 42 is an LED with two leads (not illustrated), each of which are electrically connected to a wire 36 or wire 38. The LED leads can be soldered to the wires 36 and 38. The interface between the LED and the wires 36 and 38 may be covered by a heat shrink tube 40 to protect the leads and prevent exposure of the conductive leads, solder, or internal wire. One example of heat-shrink tubing which may be used is Qualtek Q2-Z-3/64-01-SS1000FT. Each wire 36 and 38 may be heat sealed with an LED lead, and additional layers or heat seals may be placed over the contiguous pair of wires 36 and 38 and the sealed LED leads to provide structural stability to the light output unit 31 and provide better resistance to corrosion by sealing the components from environmental elements.

In certain embodiments, the light emitters 42, elongate transmission members 34, the connector 32, any interface between parts, or any portion of these components may be made more resistant to corrosion or other forms of environmental damage by dipping parts of the components or assembled light output unit 31 in a waterproof or water resistant material or compound. For example, after an LED is soldered to wires, the assembly may be dipped in a liquid or gel material, such as potting compound, wax, a coating, sealant, acrylic sealant, nail polish, or fishing rod coating/sealant (such as B.D. Classic rod coat or epoxy), that can form a water-resistant barrier once it cures. The water-resistant compound can be transparent or colored to create different lighting effects or to help obscure the wires from being easily seen.

Although not illustrated, retaining devices or clips may be formed in or attached to the light output unit 31 anywhere along or near the plurality of elongate transmission members 34 or the light emitter 42 to hold the lights in place for a particular display. The retaining devices may be in the form of hooks or adhesives, including Velcro. Any of the components described herein may be provided in a variety of colors, which can provide visual contrast or can be matched or camouflaged to hide wires in an environment. For example, components can be green, brown, black, or any color or pattern to match a plant or landscaping for the location of the lighting device. For example, the components can be black or gray to match an urban, interior, or dark background.

FIG. 3 is an exploded perspective view of part of the lighting system 20 of FIG. 2. The same reference numerals and characters, unless otherwise stated, are used to denote like features, elements, components or portions of the illustrated embodiments. The dock 30 is electrically connected to a printed circuit board (PCB) 50. In certain embodiments, the dock 30 is also mechanically connected to the PCB 50. The PCB 50 can be configured to house circuitry for a power source and control circuitry, as is described further below.

In one embodiment, a bottom housing panel 23A is mechanically detachable or hingedly connected to the bottom housing 23 to provide access to one or more power storage devices 52. A fastener 54 is used to secure the bottom housing panel 23A to the bottom housing 23. In certain embodiments, a snap fit or other connecting mechanism is used to secure the power storage device 52 within the housing 21. As illustrated, the power storage device 52 is three rechargeable batteries. In various embodiments, the power storage device 52 is one, two, three, four or more batteries with cells that can be rechargeable nickel-metal hydride, nickel cadmium or non-rechargeable alkaline or any other type of battery known in the art. In one embodiment, the batteries are AA cells. The power storage device 52 is removeably connectable to the housing 21 and the PCB 50.

Figure 4:
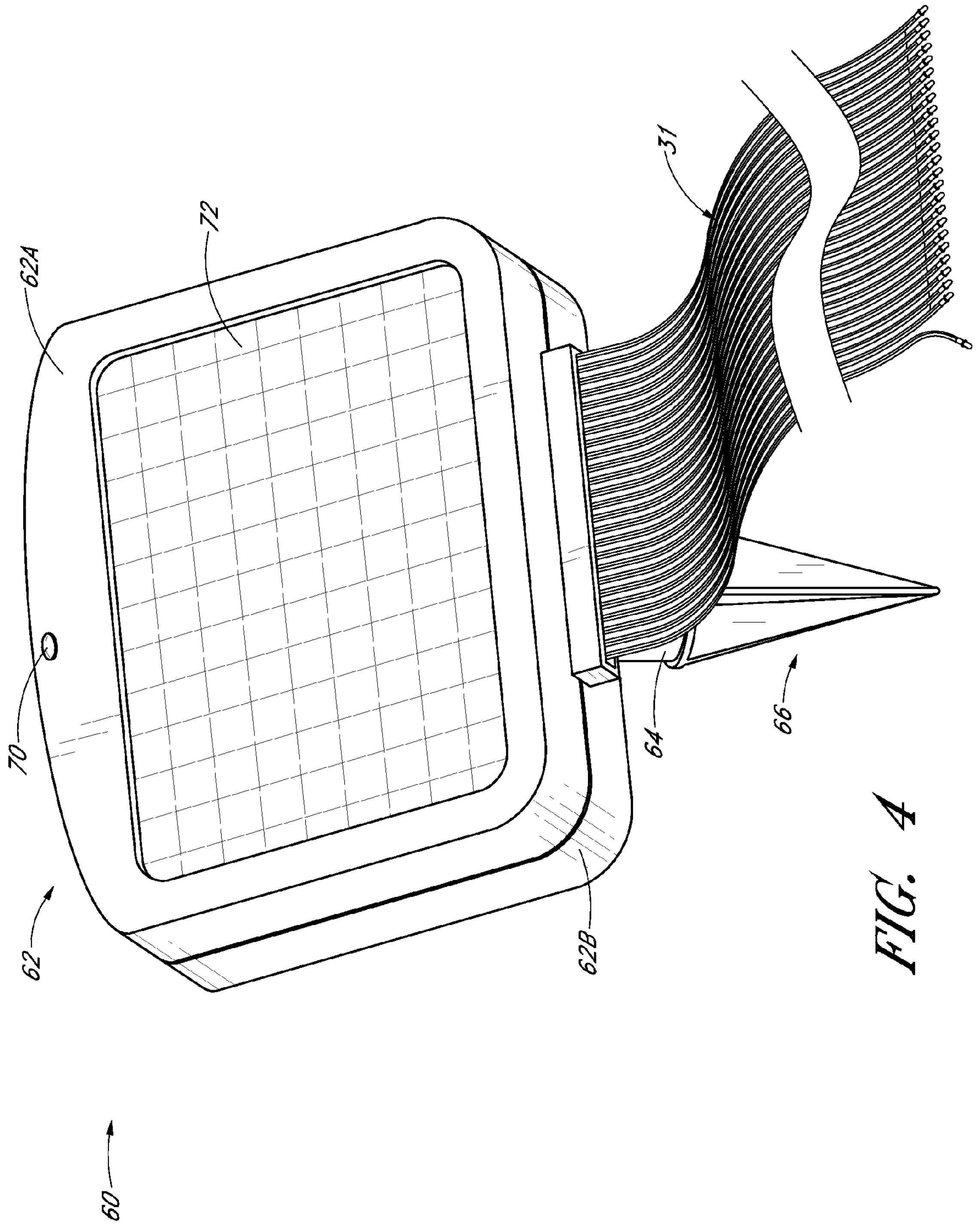
FIG. 4 is a schematic perspective view of a lighting system with a solar panel according to another embodiment of the present invention.

FIG. 4 is a schematic perspective view of a lighting system 60 with a solar panel 72 according to another embodiment of the present invention. The light output unit 31 can be similar to the light output unit described above, with certain distinctions described herein. As illustrated, the lighting system 60 comprises a housing 62 and a light output unit 31. The housing 62 comprises a top housing 62A and a bottom housing 62B. The top housing 62A and the bottom housing 62B are attachable to form a substantially enclosed housing for containing components of the lighting system 60. In certain embodiments, the lighting system 60 is similar to the lighting system 20 described above, except as described herein. As illustrated, the top housing 62A and the bottom housing 62B can be connected by a snap fit in configurations known in the art, or through other means such as fasteners, screws, rivets, bonding, welding and other attachment means. In other embodiments (not illustrated) the housing may be composed of one or more pieces. In the illustrated embodiment, the housing 62 also comprises a mounting structure 64 which has a spike 66 attached at a distal end of the mounting structure 64 which can be sized and configured for placing the lighting system 60 in dirt. Other mounting systems will be disclosed herein.

As illustrated, the solar panel 72 is placed within or on the housing 62. In alternate embodiments, the solar panel 72 may be placed at a remote location and electrically linked to the lighting system 60 through a port, such as in a manner as described with the access port 24 described in another embodiment of a lighting system above. In one embodiment, as is illustrated in FIG. 4, the solar panel 72 is located on the top face of the top housing 62A and is configured to absorb light energy and convert it into electric power. In one embodiment, the solar panel 72 comprises one or more solar cells, which can also be referred to as photocells, photovoltaic cells, or photoelectric cells, which can convert ambient light into electrical energy, which are commonly known to those of ordinary skill. A plurality of solar cells can be arranged in a solar array or a solar grid or matrix. The source of the ambient light can be natural or artificial, indoors or outdoors. The energy gathered from ambient light sources can be used to recharge a battery or it can be used to supply energy to light emitters or control circuits that control an energy storage source or a lighting display system. In some embodiments, the presence of ambient light to charge the solar panel 72 may affect internal circuitry to prevent the lighting system 60 from illuminating during charging, for example, a system might not illuminate during the day in the presence of sunlight. Further details regarding embodiments of the solar panel 72 are described below.

In certain embodiments of the lighting system 60, a sensor 70 may be disposed on the system to act as a switch for a circuit or to provide data to a controller therein. In various embodiments, the sensor may be used as a light sensor to determine when the lighting system will illuminate, a motion detector to determine if there is an audience for viewing the lighting display or for determining if wind conditions would provide assistance in creating a dynamic light display, or as a sound sensor for detecting an audience or for coordinating lighting patterns with music or other noises. The sensor 70 may also be used to measure other ambient conditions that may alter the lighting display, such as the presence of water from rain or sprinklers. More embodiments and description of the uses of the sensor is described below in connection with the controller.

Figure 5:
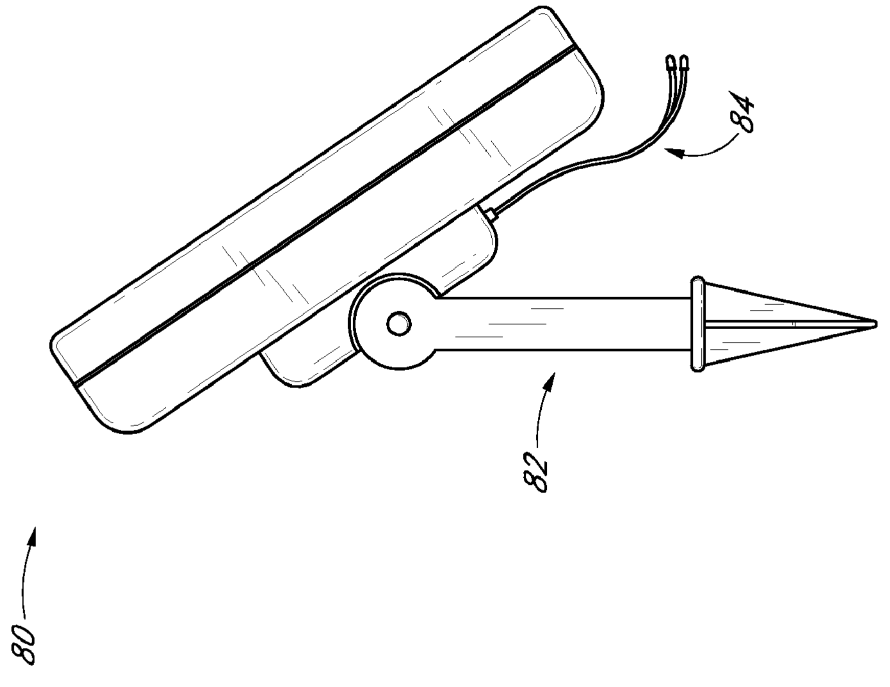
FIG. 5 is a schematic side view of a lighting system with an enclosure with a spike according to another embodiment of the present invention.

FIG. 5 is a schematic side view of a lighting system 80 with an enclosure with a spike mounting system 82 according to another embodiment of the present invention. The lighting system 80 is the same as the lighting system 60 of FIG. 4, except the light output unit 84 is attached to port on a lower portion of the bottom housing of the lighting system 80. In this manner the housing helps to shield the interface between the light output unit 84 and the rest of the system 80 to prevent rainfall and other ambient conditions from potentially affecting the interface.

Figure 6:
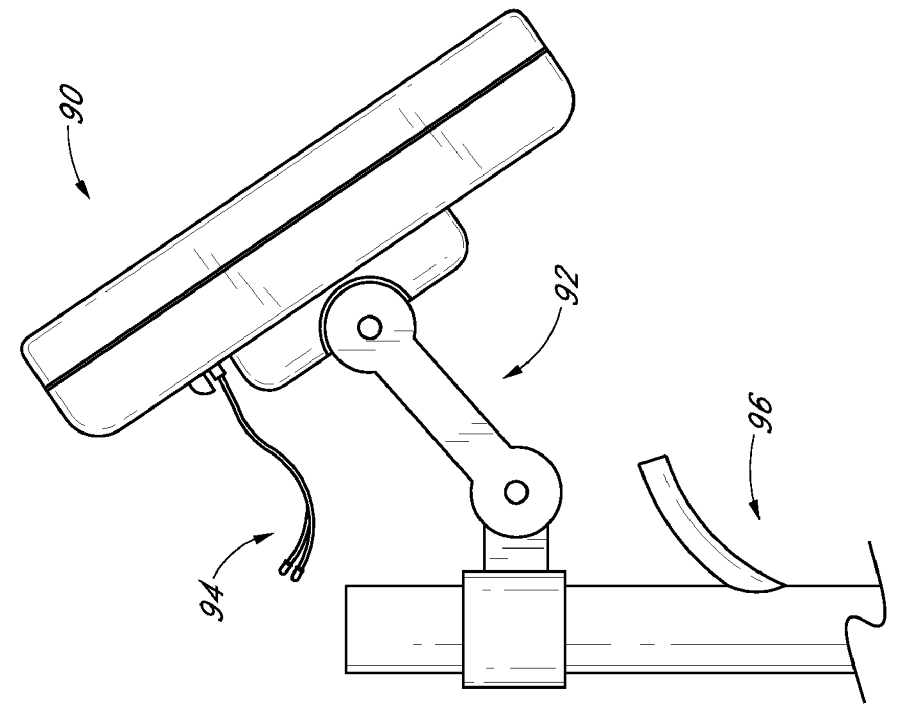
FIG. 6 is a schematic side view of a lighting system with an enclosure with a mechanism that is releaseably attachable to a body according to another embodiment of the present invention.

FIG. 6 is a schematic side view of a lighting system 90 with an enclosure with a mounting mechanism 92 that is releaseably attachable to a body 96 according to another embodiment of the present invention. Except for the mounting mechanism 92, the lighting system 90 is the same as the lighting system 60 of FIG. 4, except the light output unit 94 is attached to a port on the upper portion of the bottom housing of the lighting system 90. The interface between the light output unit 94 and the lighting system 90 is shielded from ambient elements by the configuration of the bottom housing, but is placed on the upper portion of the bottom housing to conceal wires or light tubes in the light output unit 94 as viewed from below. In various embodiments the mounting mechanism 92 is a fixed or articulatable linkage or bracket that can attach to a body 96 such as a pole or tree branch or other mounting surface for placing the lighting system 90 at an appropriate position or location for use, considering ambient light absorption for a solar panel, if one is present.

FIG. 7 is a schematic perspective view of a lighting system 100 with a round solar panel 102 and a plurality of lighting output units 104 according to another embodiment of the present invention. Any of the embodiments of the lighting systems of this invention can have multiple lighting output units, or can have a single lighting output unit with a plurality of elongate transmission members or clusters or groupings of transmission members.

Figure 8:
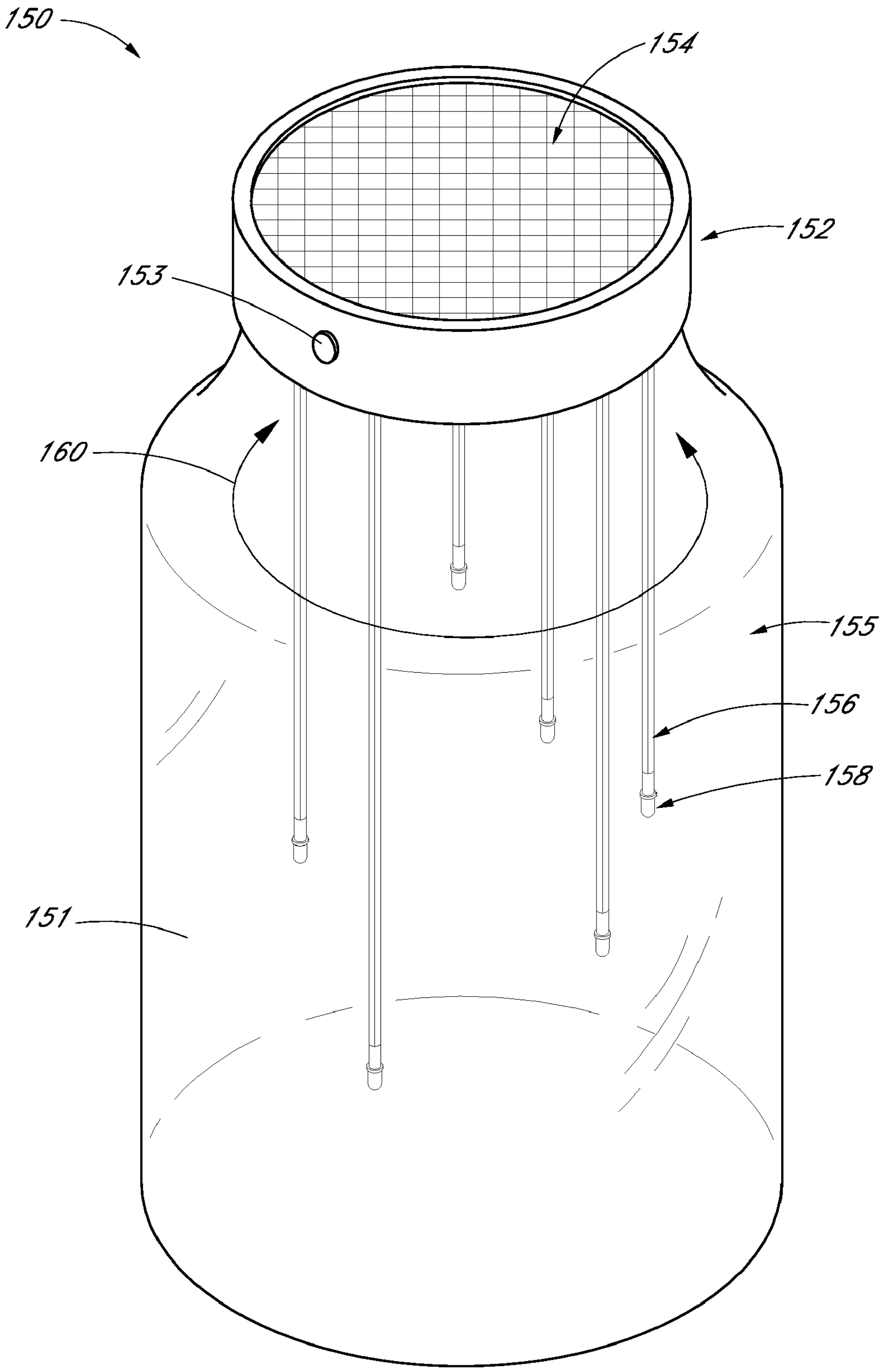
FIG. 8 is a schematic perspective view of a jar-configuration lighting system with a solar panel according to another embodiment of the present invention.

FIG. 8 is a schematic perspective view of a jar-configuration lighting system 150 according to another embodiment of the present invention. This lighting system as well as any of its components and sub-assemblies, is similar in many ways to the lighting systems, components and sub-assemblies as disclosed herein, but uses a housing that appears to be a jar filled with one or more fireflies. In one embodiment, the jar-configuration lighting system 150 comprises an upper housing 152, a lower housing 151 and a light output unit 155. One embodiment of the upper housing 152 is configured to appear to be a jar lid, and comprises a solar panel 154 and a sensor 153. Although not illustrated, certain embodiments of the upper housing 152 comprise a power source such as a battery, which may be electrically connected to an actuator such as a motor or solenoid or vibrating device which causes the light emitters or "fireflies" to appear to be moving. Although illustrated with the solar panel 154 and sensor 153, the jar-configuration lighting system 150 does not have to have a solar panel, and can rely on batteries, AC power, DC power, AC/DC power or other power sources as described herein. One embodiment of the lower housing 151 is configured to appear to be an at least partially transparent jar, enclosure, or container. One embodiment of the light output unit 155 comprises a plurality of elongate light-transmission bodies 156 with one or more light emitters 158 disposed along or at a distal end of the elongate light-transmission bodies 156.

As illustrated, the elongate light-transmission bodies 156 look straight and may swing from the upper housing 152. In other embodiments the elongate light-transmission bodies 156 are bent or sculpted to look visually interesting or to assist in creating visual effects. In one embodiment of the lighting system 150 has an actuator (not illustrated) in the upper housing 152 which may be used to dynamically actuate the elongate light-transmission bodies 156. For example, an actuator may be a solenoid or a motor that continuously or intermittently activates to vibrate or rotate (such as with arrow 160) a portion of the upper housing 152 such that the light emitters 158 move. Some patterns may be configured to approximate flying fireflies. Although not illustrated, one embodiment of the lighting system 150 also comprises a fan or pump which may be housed within the upper housing 152 to create a dynamic lighting display, using air currents to cause the light emitters 158 to oscillate or move within the lower housing 151. In another embodiment, not illustrated, light emitters may be connected to the bottom of a jar using more rigid wires, and the circuitry, motor, and other elements may be located in the bottom of the jar.

Figure 9:
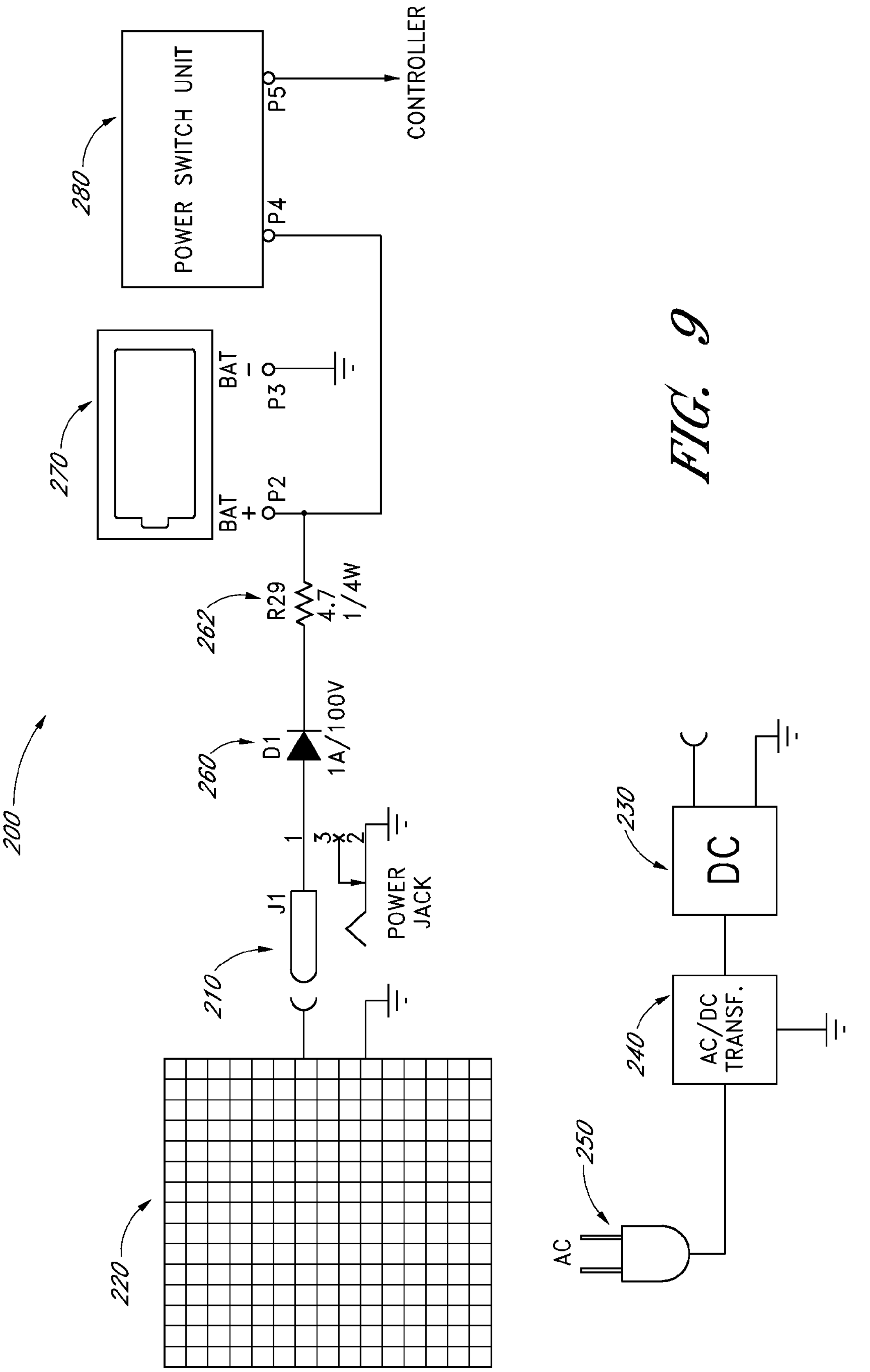
FIG. 9 is a block diagram of a power source circuit for a lighting system according to one embodiment of the present invention.

FIG. 9 is a block diagram of a power source circuit 200 for a lighting system according to one embodiment of the present invention. The embodiments shown are for purposes of illustration only and are not intended to limit the scope of the invention or the claims to any one particular circuit logic. The illustrated embodiments as well as equivalents thereto and any other circuit logic that performs the functions generally described herein are within the scope of the invention and the claims. This power source circuit 200, or certain components of the circuit, may be used in conjunction with any of the embodiments of lighting systems described herein. In certain embodiments, the power source circuit may be comprised of one or more batteries 270 as a sole power source. Alternatively, one or more power sources may be used to provide electrical power to the power source circuit 200. For example, solar panels 220 may be used as a sole power source. Likewise, a direct current (DC) or alternating current (AC) power source may be used as a sole power source. As illustrated, the power source circuit 200 comprises several of these power source alternatives which may be used alone or in conjunction with each other and which are removeably connectable with each other.

In one embodiment, the power source circuit 200 comprises a power jack 210, a battery 270 and a power switch unit 280. The power jack 210 is optionally and removably electrically connected to one or more in a group of power sources consisting of a solar cell 220, an AC power source 250, an AC/DC transformer 240, a DC power source 230, and any other known power source. Any of these power sources can be used to charge or recharge a power storage unit, such as the battery 270 depicted in the figure. The power jack 210 can be a switch, a connection, or a port configured to connect with a jack to become electrically connected to a power source. In certain preferred embodiments, the power jack 210 is connected to one or a series of components to prevent the discharge of the batteries though one of the power sources, such as with a solar panel when the panel is receiving no or little ambient light to convert into electrical energy. As illustrated, a diode 260, such as a blocking diode or rectifier may be used to prevent the electrical power drain from the battery 270 to a power source. Other embodiments may use an electron valve, one-way current device, or other circuitry to prevent discharge of the battery 270 upstream toward the power source. Although not illustrated here, any power source supplying electrical power to the batteries may also be controlled by a circuit to regulate the charging of the batteries. Resistors, such as resistor 262 and others in FIG. 10, can be used as needed to regulate the current flowing across a circuit. In the illustrated embodiment, resistor 262 works in conjunction with diode 210 to control charging current to a rechargeable battery when an external AC/DC power supply, such AC/DC transformer 240, is attached. For example, when a 5 volt external power supply is used, the diode 210-resistor 262 combination provides a voltage drop to allow three NiMH cells to fully charge without overcharging.

The battery 270 is one example of any power storage unit which can store electrical energy to be discharged into a controller or to illuminate the light emitters of a light display system. As mentioned above, batteries can be any of a variety of chargeable or rechargeable batteries known in the art.

The power switch unit 280 may optionally be placed between the battery 270 or power source and the controller of the lighting device. In one embodiment the power switch unit 280 is a manual switch that can be toggled on or off to turn the lighting system on and off In another embodiment the power switch unit 280 is a photo-switch which can sense light to provide a signal to allow electrical energy from a solar panel 220 to charge the battery 270 while preventing electrical discharge of the battery 270 to the controller so the lighting display is not active during periods of ambient light, such as during the day. When there is little or no ambient light, the photo-switch can be configured to prevent the circuit from the battery 270 to the solar panel 220 from discharging energy to the solar panel 220 by essentially opening the circuit. Furthermore, the photo-switch can be configured to electrically connect the battery 270 to the connector, or essentially close the circuit between these components. For example, a photo-switch may be a sensor such as sensor 70 in FIG. 4 or sensor 153 in FIG. 8. In other embodiments, a solar panel 220 may be sophisticated enough to sense light and act as a photo switch itself For example, U.S. Pat. No. 5,041,952 to Janda, et al. issued Aug. 20, 1991 describes the dual use of a photovoltaic for charging purposes and for controlling the operation of a lamp which allows for the elimination of other means such as a photo cell to detect darkness.

In another embodiment the power switch unit 280 is an optical sensor, infrared sensor, motion detector, sound detector, thermometer, barometer, or other measuring sensor as mentioned above. In some embodiments the power switch unit 280 is controlled by logic or a microprocessor in the controller.

Figure 10:
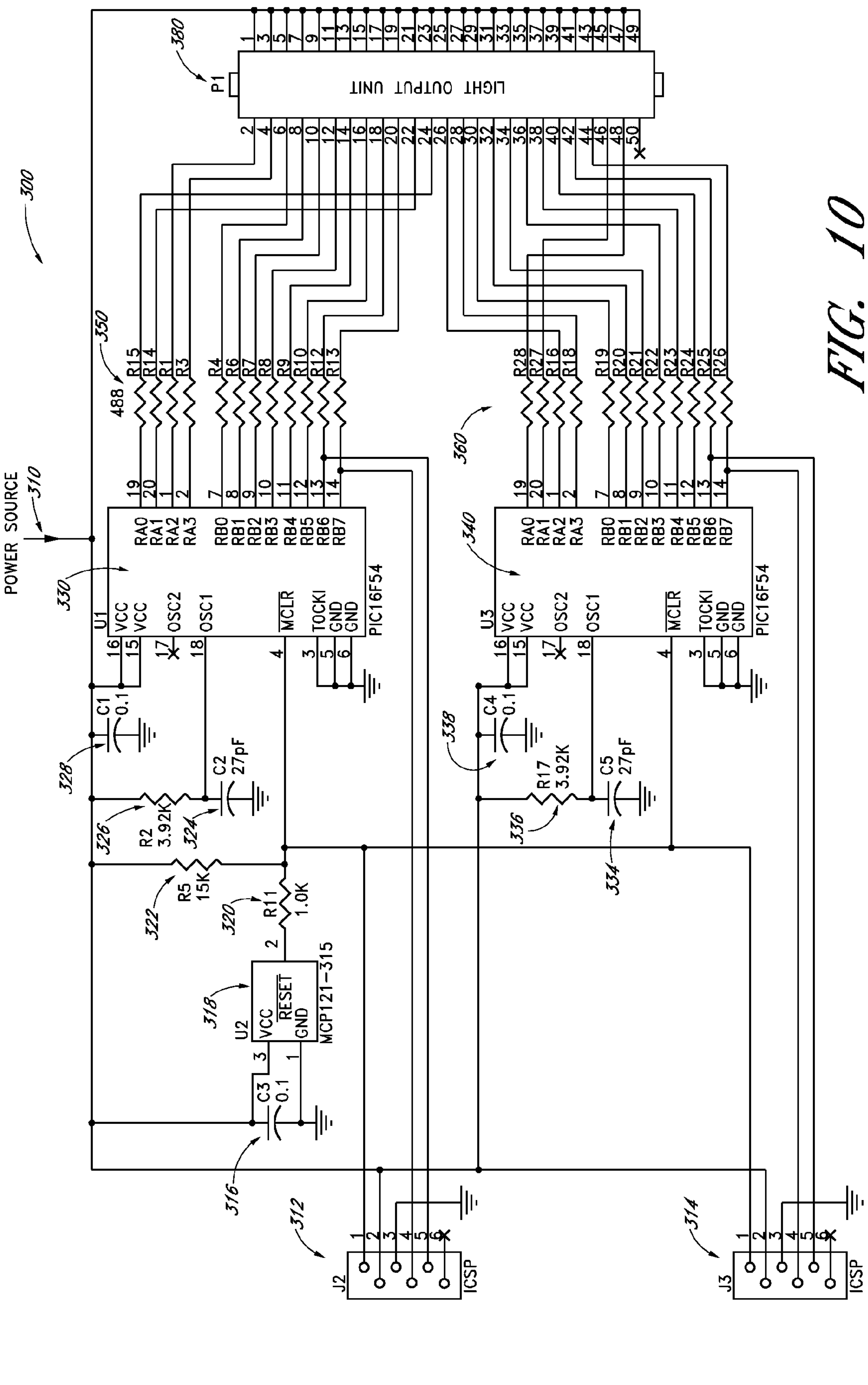
FIG. 10 is a schematic diagram of a controller circuit for a lighting system according to one embodiment of the present invention.

FIG. 10 is a schematic diagram of a controller circuit 300 for a lighting system according to one embodiment of the present invention. It is readily apparent to a person skilled in the art that there are many circuit variations possible for enabling and controlling a lighting system without departing from the spirit and scope of the invention as described herein. The controller circuit 300 is electrically connected to other circuits or sub-circuits, such as electrical power supplied from a power source 310 and at least one light output unit 380. The power source 310 may be similar to other embodiments of power sources such as described at FIG. 9 and with other sources described herein. The light output unit 380 may be similar to other embodiments of power sources such as described at FIGS. 2-8 and 17-25 and with other light output units described herein. The controller circuit 300 illustrated in this embodiment is configured to control twenty-four light emitters. The controller circuit 300 comprises one or more microprocessors, central processing units (CPU) or micro-controller units (MCU) such as MCU 330 and 340, one or more CPU or MCU supervisor integrated circuits (IC) such as CPU IC 318, one or more data connectors such as data connectors 312 and 314, various capacitors such as capacitors 316, 324, 328, 334 and 338 and resistors such as resistor 320, 322, 326, 336, 350 and 360 and others which can be used as needed to regulate the current flowing across the circuit. It will be apparent to a person skilled in the art that other diode, capacitor, processor, and resistor configurations may be utilized without departing from the spirit and scope of the invention. The data connectors 312 and 314 may be optionally included to provide a jack for programming the MCUs 330 and 340 to alter, vary or program lighting display features such as brightness, color, duration, timing, response to sensor input, and more. These components of the controller circuit 300 may be connected to or integrated into a printed circuit board PCB as is illustrated in one embodiment in FIG. 3 at PCB 50. The outputs of the MCUs provide current to portions of the light output unit 380 to indicate which light emitters are to light up at specific times and intervals subject to the programming of the MCUs.

For example, the light emitters (not illustrated) of the light output unit 380 may be biased or pulsed by a short duration electrical pulses or current signals from the MCUs 330 and 340 to produce varying levels of brightness or other lighting visual effects, such as flickering, flashing, ramping up and down in brightness, and strobe light effects. The control circuit 300 MCUs 330 and 340 can be configured or programmed to modify the current or voltage to optimize the visual light display. As described with the sensor of various embodiments above, the control circuit 300 may be electrically connected to a sensor (not illustrated here) to use sensor data to alter or modify a lighting display in response to sensor data to light, sound, temperature, movement, humidity, or other ambient conditions.

In some embodiments, the controller circuit 300 is programmed to twinkle, flutter, flash, flicker, fade, or illuminate at various timing intervals. The controller circuit 300 is controlled by software code that is customizable and that can provide options to a user and be pre-programmed to vary lighting displays for various events, markets, or locations. One embodiment of a controller circuit 300 is reprogrammable and can be configured to create event-specific lighting or sound pattern, such as flashing four times for a fourth birthday or anniversary. Other embodiments can be programmed to simulate certain species or sexes of fireflies. For example, certain firefly species exhibit interesting lighting displays such as *Photinus ignitus*, and Asian fireflies such as *Pteroptyx Malacca, Pteroptyx Cribellata* which give synchronized flashing displays. For example, a male may have a longer illumination period such as approximately 5.2 seconds while a female firefly may illuminate for 2.9-3.9 seconds depending on mating rituals, patterns and behaviors. While certain light emitters may be programmed with one pattern, other light emitters in the same light output unit may be programmed with other patterns, and patterns may be used, exchanged, and repeated on various light emitters. In some embodiments, the light pattern may be program to appear random. Periods of illumination, illumination intensity and brightness, timing to achieve and terminate illumination and many other features may be programmed to create symmetric or non-symmetric lighting timing patterns.

In one embodiment, a control circuit 300 may be configured to rotate through a plurality of preset possible lighting patterns with varying durations of wait times between patterns. The software code used to program the control circuit 300 implements an independent "virtual machine" for each light emitter in a light output unit 380. Each light emitter machine runs independently of one another. Each machine randomly selects and performs one of several possible flash patterns and generates a random wait time between flashes. There is no communication between the virtual machines. Each runs on its own. The overall display produced is the aggregate result of each light emitter's independent randomness. There may be twelve machines for twelve light emitters or twenty-four machines for twenty-four light emitters, or other numbers depending on the number of distinct lighting patterns desired.

In this embodiment, each light emitter has a brightness value ranging from 0 to 255, where "0" represents a non-illuminated state or level where the light emitter is essentially off and where "255" represents a maximum brightness level for the light emitter. Numbers between 0 and 255 incrementally represent brightness levels between the non-illuminated and maximum brightness levels of the light emitter. When a flash is being performed, this value is varied in order to produce the dynamic patterns of the flash. In one embodiment, the controller can randomly select light emitter brightness levels for various periods of time. In some embodiments the controller can vary the timing of a pattern for a random rate within a range of values. In still other embodiments, the controller can randomly select patterns from a table of light patterns in non-volatile memory that is used to control the variation of a light emitter's brightness value. This table uses a very simple code to store the patterns of several possible flashes. The pattern table stores several different patterns. Each pattern consists of one or more entries. Each table entry can consist of two numbers. The first number in an entry is a value between −127 and +127. A value of zero indicates this entry is the end of the particular pattern. Otherwise, the value is simply added to the light emitter brightness value. This means a negative value causes the light emitter to get dimmer and a positive value causes the light emitter to get brighter. The second number in an entry is a value between 0 and 255. This number sets the limit on the light emitter brightness for the entry. When the light emitter reaches this limit, the machine moves on to the next entry in the table. When performing a flash, the addition operation is executed approximately 40 times per second. The greater the magnitude of the first number, the faster the light emitter will reach the brightness value given by the second number.

Here is an example of a very simple flash pattern:

| | | |
|---|---|---|
| First entry: | 127 | 254 |
| Second entry: | −1 | 0 |
| Third entry: | 0 | |

The light emitter always starts out with a brightness value of zero at the beginning of a pattern. After 1/40th of a second, its brightness will be 127. Another 40th of a second and it is 254. To the human eye, the light emitter appears to have turned on to full brightness instantaneously. The machine now starts executing the second entry. Each 40th of a second, the light emitter brightness will be reduced by 1. It will take 254/40, i.e., over 6 seconds, for the light emitter brightness to fade to zero. This will be perceived as a slow fade. When zero brightness is reached, execution moves on to the third entry. Since this entry is zero, the light emitter is turned off and a random wait time passes until the light emitter starts a new pattern. In other embodiments, much more complex patterns are possible. The length of the table is limited only by the amount of available memory in the target hardware. Even the cheapest PIC microcontroller has enough room for rather lengthy and complex patterns, if desired.

For example, in one embodiment the control circuit 300 is configured with four possible flash patterns stored in fixed, non-volatile memory. The amount of time an LED remains dark, i.e., the wait time, is random. At the end of this wait time, the LED starts showing one of the four possible flash patterns, selected randomly. This embodiment exhibits two "random" parameters: wait time between flash patterns, and which flash pattern is shown. The flash patterns themselves are fixed and not variable.

Various pre-programmable lighting patterns, as represented by scope images charting brightness of a single exemplary light emitter based on programming of the MCU and circuitry in the controller circuit 300 are illustrated for the purpose of examples in FIGS. 11-16 and do not limit the possibilities or capabilities of the embodiments described. Various embodiments of a controller circuit of a lighting display system of the present invention can be programmed to create illustrated and other light patterns for a light emitter. For the purposes of illustration, the grid lines provided on FIGS. 11-16 represent 1 second per grid line in the horizontal axis. In the vertical axis, the maximum level of brightness depends on the type of light emitter used and the desired lighting effect programmed into the control circuit 300. For the purposes of description, the peak or maximum brightness in these figures is taken to correspond to the maximum brightness of the light emitter, though it is understood in the art that the level of brightness may be reduced for a particular application or desired effect.

Figure 11:
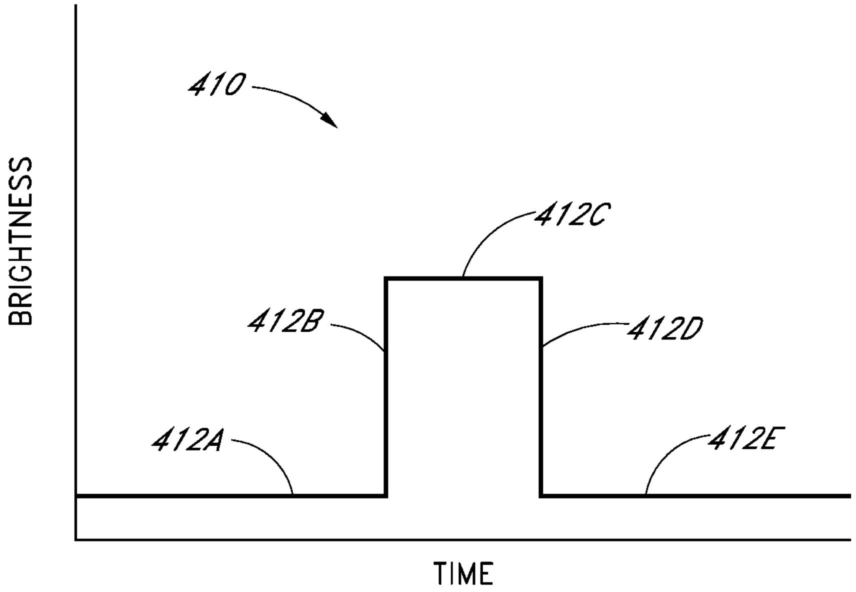
FIG. 11 (PRIOR ART)
FIG. 11 is a schematic representation of a lighting pattern depicting brightness over time for at least one light output element of a lighting system as known in the art and according to one embodiment of the present invention.

FIG. 11 is a schematic representation of a light pattern 410 depicting brightness over time for at least one light output element of a lighting system as known in the art and according to one embodiment of the present invention. Generally available lighting systems for holiday decorations tend to provide substantially constant illumination levels (not illustrated) or pulsing lighting levels as illustrated in FIG. 11, where the light turns on for a first duration and turns off for a second duration before flashing on again. The simple switching circuitry on most art provides a substantially instantaneous jump between on and off states for a light emitter. Various embodiments of a controller circuit of a lighting display system of the present invention can be programmed to create such a light pattern for a light emitter. As illustrated, light pattern 410 starts with a non-illuminated or "off" portion 412A, followed by a rapid, or substantially instantaneous, increase in brightness along portion 412B to a peak or maximum-illumination level at portion 412C, followed by a rapid decrease in brightness along portion 412D to return to a non-illuminated or "off" level at portion 412A FIGS. 12-16 represent schematic representations of light patterns or pulse signals depicting brightness over time of various lighting patterns. Specifically, the images were taken off an oscilloscope with a filter capable of measuring current applied to a light emitter over time and accurately represent the timing and relative intensity of the brightness of various embodiments of lighting systems.

The distance between the vertical lines of the grid represent one second intervals, and contain four hatch marks between each vertical line along the time axis to represent 1/5 of a second, or 0.2 seconds.

The horizontal lines of the grid represent an average current level being applied to a light emitter for each fraction of a second—which corresponds to relative brightness. The "brightness" or "average current level" corresponding to perceived intensity of a light emitter can be perceived by the human eye in a different manner than a light emitter is driven by a particular current for a particular time. For example, an incandescent or analog bulb can create an intensity or brightness of perceived light that is approximately proportional to the current applied to that bulb. As more current is applied, the brighter the bulb gets, within certain limits of the bulb to start illumination and reach maximum brightness capacity of the bulb before it blows out. Furthermore, as a current is applied to a bulb, the intensity increases, but the human eye does not perceive the current-to-brightness relationship in a linear manner—instead, the human eye perceived the increased current levels on a bulb in a more logarithmic manner. As shown, FIGS. 12-16 portray the "average current" applied to a light emitter at a particular point in time over a timed lighting pattern. The "brightness" axis corresponds to a linear display of the average current being applied to that light emitter. The human eye, however, would perceive the brightness of the light emitter in more of a logarithmic scale. Thus, the linear representations in FIGS. 12-16 would be perceived by a human eye with much more sensitivity at the lower levels (near non-illumination levels) than at the higher brightness/average-current levels (near maximum illumination). Thus, subtle variations at the bottom of these linear "brightness vs. time" charts in FIGS. 12-16 are more distinctly perceivable by the human eye than subtle variations at the top of each wave pattern. With LEDs, it is known in the art that pulse width modulation (PWM) can be used to change perceived brightness or intensity of the LED. For example, a LED is generally driven by micro-second flashes or bursts of either being "on" or "off"—depending on the duty cycle of the LED. Within a fraction of a second, when a LED is on 90% of the time, it appears bright. When it is on 5% of the time it appears dim. Variations between non-illumination and maximum-illumination vary depending on the duty cycle of the LED under PWM. The human eye generally can not perceive the microsecond bursts of LED light, instead the human eye perceives and "averages" the pulses into what may be perceived as an "analog" brightness level. In FIGS. 12-16 the actual light emitter being measured was a LED driven by a controller under PWM to give the LED a varying duty cycle over time, creating an average current (the average current applied at the fraction of a second taking the PWM duty cycles into account) which is labeled "BRIGHTNESS" in the figures. PWM is known in the art. As is discussed further herein, some LED embodiment references to brightness should be understood to involve a measure of average current being applied with PWM on the LED.

In FIGS. 12-16 the relative height of the pulse signals can vary depending on the relative brightness capacity and average driving current supplied to a light element. For the purposes of illustration in these figures, the relative brightness in a single FIGURE represents the change in brightness over time between a "zero" or non-illuminated state to a maximum brightness state corresponding to a peak brightness level on that single FIGURE. Brightness should not be compared between figures. Instead, the relative brightness of the lighting pattern should be understood to vary between non-illumination to the maximum capacity of a lighting element. As is known to one skilled in the art, certain lighting elements can be driven to lower levels than the maximum capacity, and some lighting elements may appear to be illuminated to a particular brightness or intensity by the variation of visually imperceptibly fast flashes with varying dormant and illuminated periods within a fraction of a second, as described in more detail above.

Figure 12:
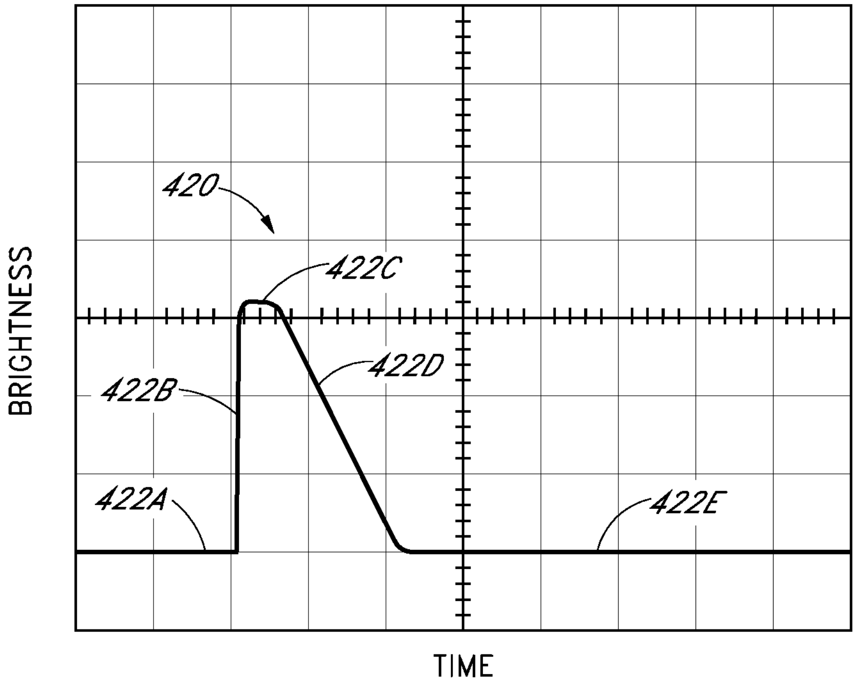
FIG. 12 (PRIOR ART)
FIG. 12 is a schematic representation of a pulse signal depicting brightness over time for at least one light output element of a lighting system as known in the art and according to one embodiment of the present invention.

FIG. 12 is a schematic representation of a pulse signal 420 depicting brightness over time for at least one light output element of a lighting system as known in the art and according to one embodiment of the present invention. Some lighting systems may utilize incandescent bulbs which may illuminate and fade in response to a current at a slower rate as the lighting element in the bulb heats up and cools off before remaining un-illuminated until the next signal or current activates the bulb again. Other systems may use LEDs which can use PWM duty cycles to change perceived brightness of the LED, as described above. Various embodiments of a controller circuit of a lighting display system of the present invention can be programmed to create such a light pattern for a light emitter. In one embodiment of a pulse signal 420, the average current applied to a light emitter (or light emitter brightness) changes from a non-illuminated level at portion 422A to a maximum-brightness level at an upward rate along a portion 422B in a first duration of time, maintains a peak (or maximum-brightness) level at portion 422C for a second duration, and then ramps downward at a relatively constant downward rate along portion 422D from the maximum-brightness level to the non-illuminated level at portion 422E for a third duration. As illustrated, one embodiment of a pulse signal 420 changes from a non-illuminated level at portion 422A to a maximum-brightness level substantially instantaneously, or at an upward rate faster than is perceivable by the human eye, along a portion 422B, maintains a peak (or maximum-brightness) level at portion 422C for approximately 0.5 seconds, and then ramps downward at a relatively constant downward rate along portion 422D from the maximum-brightness level to the non-illuminated level at portion 422E in approximately 1.8-2.0 seconds. The entire active period of this pattern is approximately 2.1 seconds.

Figure 13:
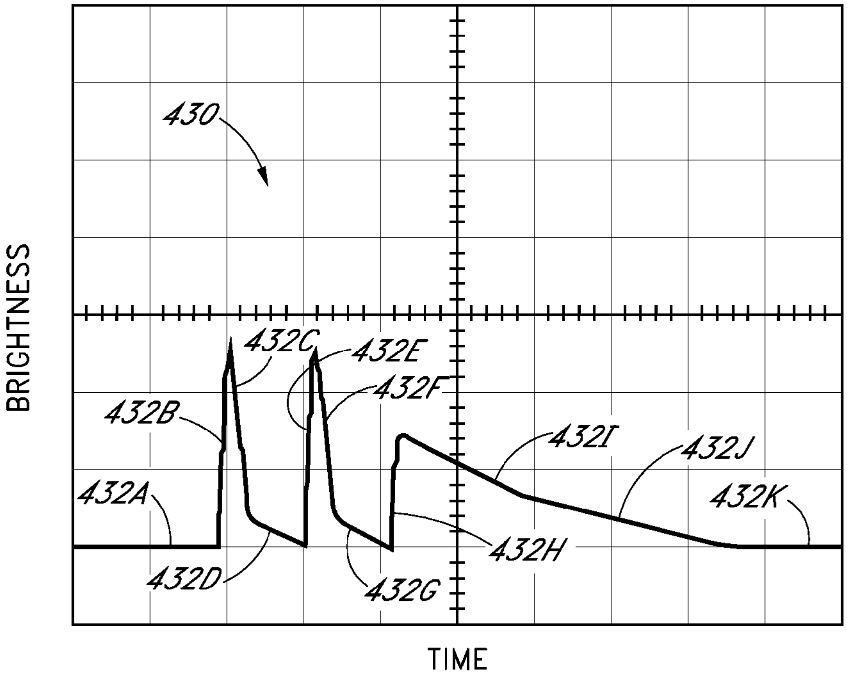
FIG. 13 is a schematic representation of a pulse signal depicting brightness over time for at least one light output element of a lighting system according to one embodiment of the present invention.

FIG. 13 is a schematic representation of a pulse signal 430 depicting brightness over time for at least one light output element of a lighting system according to one embodiment of the present invention. One embodiment of a lighting pattern starts with one or more sequential rapid flashes or pulses followed by a relatively slower ramp down in illumination brightness. This pattern draws attention to a lighting element with the rapid full-intensity flashes then follows through with a soothing gradual fade to darkness. In one embodiment of a pulse signal 430 the average current applied to a light emitter (or light emitter brightness) changes from a non-illuminated level at portion 432A to a maximum-brightness level along portion 432B at a first rate in a first duration of time, ramps downward along portion 432C at a second rate for a second duration of time, ramps downward in brightness at a third rate along portion 432D to return to the non-illuminated level in a third duration of time, and repeats the same cycle again with portions 432E-432G. After the two pulses with dual-rate tapering ramp-down patterns, the lighting pattern increases in brightness along portion 432H to a portion of the maximum-brightness level at a fourth rate in a fourth duration of time then tapers to a fifth ramp rate along portion 432I in a fifth duration of time then starts a sixth ramp rate along portion 432J to return to the non-illuminated level at portion 432K in a sixth duration of time. As illustrated, one embodiment of a pulse signal 430 changes from a non-illuminated level at portion 432A to a maximum-brightness level along portion 432B at a first rate substantially within less than 0.2 seconds, ramps downward along portion 432C at a relatively constant second rate for approximately 0.1 to 0.15 seconds and then ramps downward in brightness at a third rate along portion 432D to return to the non-illuminated level in approximately 0.8 seconds, then repeats the same cycle again with portions 432E-432G. After the two pulses with dual-rate tapering ramp-down patterns, the lighting pattern increases in brightness along portion 432H to approximately 50%-70% of the maximum-brightness level within approximately 0.1 seconds then tapers to a downward ramp rate along portion 432I for approximately 1.6 seconds then starts another downward ramp rate along portion 432J to return to the non-illuminated level at portion 432K in approximately 2.5 seconds. The entire active period of this pattern is approximately 6.0-6.5 seconds.

Figure 14:
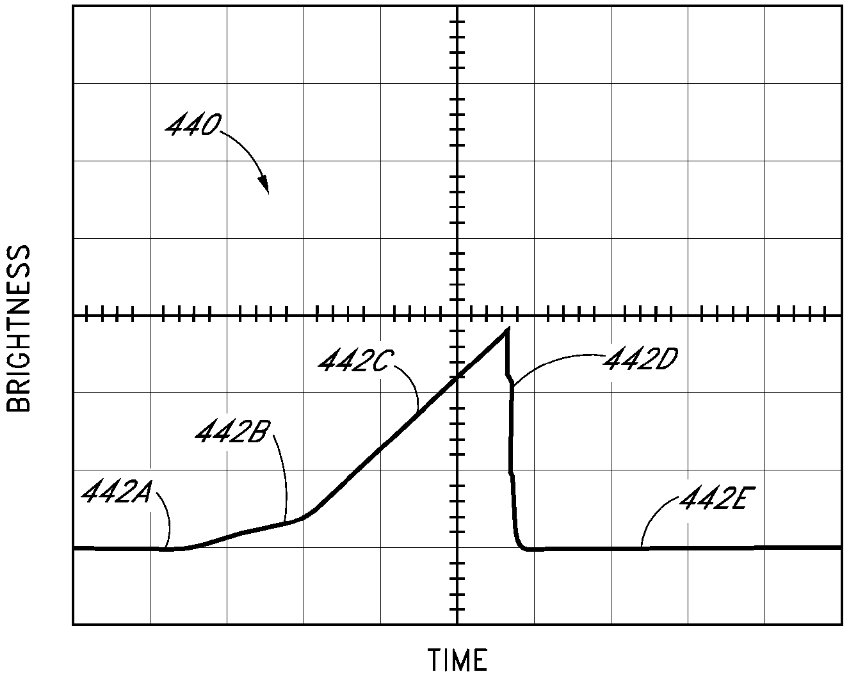
FIG. 14 is a schematic representation of a pulse signal depicting brightness over time for at least one light output element of a lighting system according to one embodiment of the present invention.

FIG. 14 is a schematic representation of a pulse signal 440 depicting brightness over time for at least one light output element of a lighting system according to one embodiment of the present invention. As illustrated, this embodiment of a lighting pattern gradually increases brightness over a relatively long time then decreases illumination relatively quickly. One embodiment of a pulse signal 440 changes from a non-illuminated level at portion 442A to ramp upward in brightness at a first upward rate along portion 442B for a first duration, then changes to a second upward rate along portion 442C for a second duration to achieve 100% of the maximum-brightness level, then drops off along portion 442D in first downward rate in a third duration to the non-illuminated level along portion 442E. As illustrated, one embodiment of a pulse signal 440 changes from a non-illuminated level at portion 442A to ramp upward in brightness at a first rate along portion 442B for approximately 1.5 seconds, then changes to a second upward in brightness ramp rate along portion 442C for approximately 2.5-2.8 seconds to achieve 100% of the maximum-brightness level, then drops off along portion 442D in a relatively steep down ramp in approximately 0.1 seconds to the non-illuminated level along portion 442E. The entire active period of this pattern is approximately 4.1 to 4.5 seconds.

Figure 15:
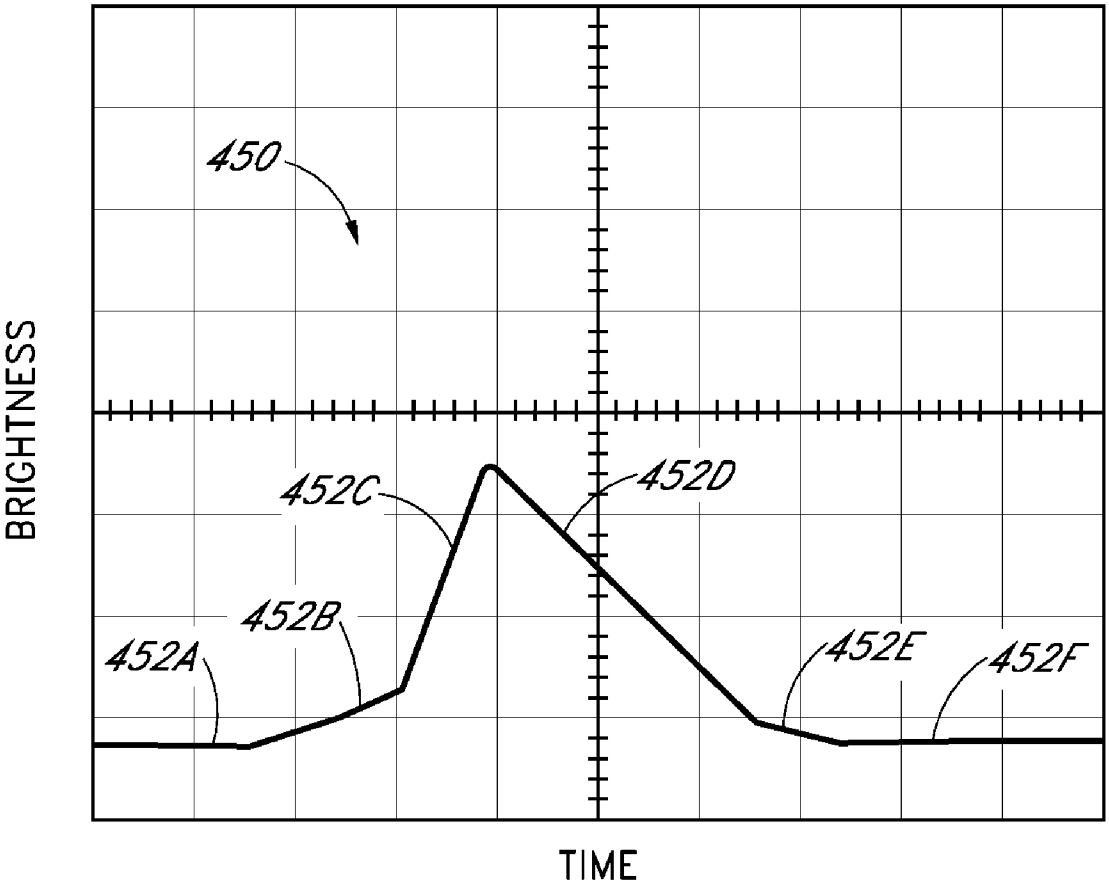
FIG. 15 is a schematic representation of a pulse signal depicting brightness over time for at least one light output element of a lighting system according to one embodiment of the present invention.

FIG. 15 is a schematic representation of a pulse signal 450 depicting brightness over time for at least one light output element of a lighting system according to one embodiment of the present invention. As illustrated, this embodiment of a lighting pattern gradually increases brightness over time with varying rates of changing brightness, then decreases illumination at one or more varying rates of changing brightness. This embodiment includes a gradual increase in illumination followed by a gradual decrease in illumination. One embodiment of a pulse signal 450 changes from a non-illuminated level along portion 452A to ramp upward in brightness at a first upward ramp rate along portion 452B for a first duration, then changes to a second upward ramp rate along portion 452C for a second duration to achieve 100% of the maximum-brightness level, then reduces brightness at a first downward ramp rate along portion 452D for a third duration, then reduces brightness at a second downward ramp rate along 452E to return to the non-illuminated level along portion 452F in a fourth duration. As illustrated, one embodiment of a pulse signal 450 changes from a non-illuminated level along portion 452A to ramp upward in brightness at a first upward ramp rate along portion 452B for approximately 1.5 seconds, then changes to a second upward ramp rate along portion 452C for approximately 0.7-0.8 seconds to achieve 100% of the maximum-brightness level, then reduces brightness at a first downward ramp rate along portion 452D for approximately 2.4-2.6 seconds, then reduces brightness at a second downward ramp rate along 452E to return to the non-illuminated level along portion 452F in approximately 0.8 seconds. The entire active period of this pattern is approximately 6 seconds.

Figure 16:
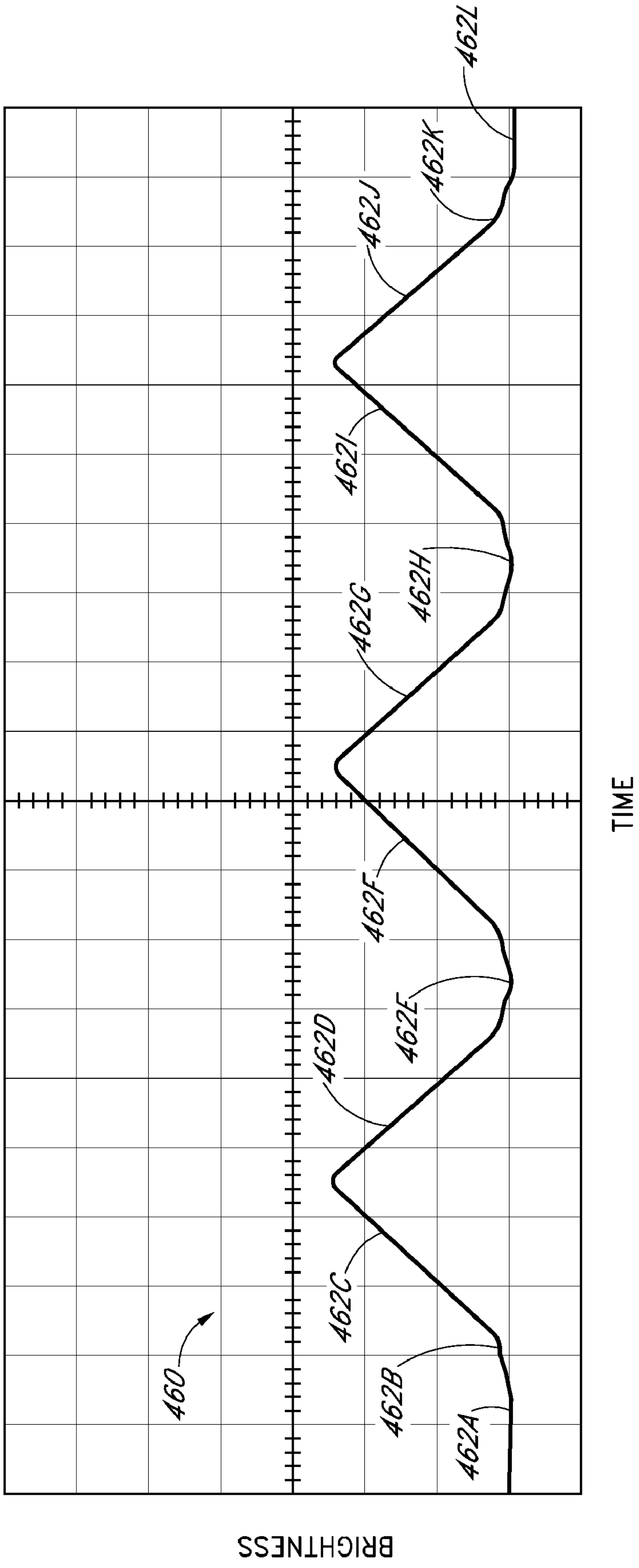
FIG. 16 is a schematic representation of a pulse signal depicting brightness over time for at least one light output element of a lighting system according to one embodiment of the present invention.

FIG. 16 is a schematic representation of a pulse signal 460 depicting brightness over time for at least one light output element of a lighting system according to one embodiment of the present invention. As illustrated, this embodiment of a pulse signal 460 gradually illuminates and fades one or more times in a substantially symmetric pattern before returning to a dormant state before the next pattern emerges. Optionally, at portions of a light pattern there may be slight variations in rates perceptible to the human eye as a "fluttering" of the light between partial illumination of up to approximately 50% of the maximum-brightness level and lower brightness levels. In certain embodiments, fluttering may oscillate in brightness between lower levels of brightness relative to 50%, 40%, 30%, 25%, 20%, 15%, 10%, 5% and 2% of the maximum brightness level. As described above, the human eye perceives the linear representations of average current to a light emitter in a logarithmic scale, thus the human eye is more sensitive to slight variations near the bottom of the linear charts in FIGS. 12-16 than to fluctuations at the tops of these figures. One embodiment of a pulse signal 460 changes from a non-illuminated level along portion 462A to flutter at portion 462B with varying changes in brightness near the non-illumination brightness level for a first duration before initiating a relatively consistent upward ramp in brightness along portion 462C for a second duration before reaching the maximum-brightness level, at which point the light pattern decreases brightness at a relatively consistent downward ramp rate along 462D for a third duration before entering another period of fluttering at portion 462E for a fourth duration. This pattern can repeat itself one or more times, and as illustrated, it repeats two more times along portions 462E-462K and terminating at a non-illuminated state along portion 462L. As illustrated, one embodiment of a pulse signal 460 changes from a non-illuminated level along portion 462A to flutter at portion 462B with varying changes in brightness near the non-illumination brightness level for approximately 1 second before initiating a relatively consistent upward ramp in brightness along portion 462C at for approximately 2.5 seconds before reaching the maximum-brightness level, at which point the light pattern decreases brightness at a relatively consistent downward ramp rate along 462D that is symmetric or changing brightness at a similar rate (but opposite direction) to the relatively consistent upward ramp for approximately 2.5 seconds before entering another period of fluttering at portion 462E for approximately 1 second. This pattern can repeat itself one or more times, and as illustrated, it repeats two more times along portions 462E-462K and terminating at a non-illuminated state along portion 462L, resulting in an overall pattern lasting approximately 18 seconds comprising three peak brightness levels. In another embodiment, the light pattern is similar to the aforementioned light pattern but has no fluttering stages. In other embodiments, the fluttering light pattern may be used with any light pattern.

In one embodiment, a controller is configured to randomly select among any of the group comprising lighting patterns 410, 420, 430, 440, 450, and 460 to be displayed at any light emitter in the lighting system, with a set or a random period of time in which the light emitter is non-illuminated between displaying the patterns. In one embodiment, the selection of the light emitter among a plurality of light emitters to display a lighting pattern is random.

Note that any of the foregoing lighting patterns can be varied in relative brightness, speed, ramp rates, as well as repeated or combined to generate other patterns. The controller in the system can be programmed to create virtually any pattern.

Figure 17:
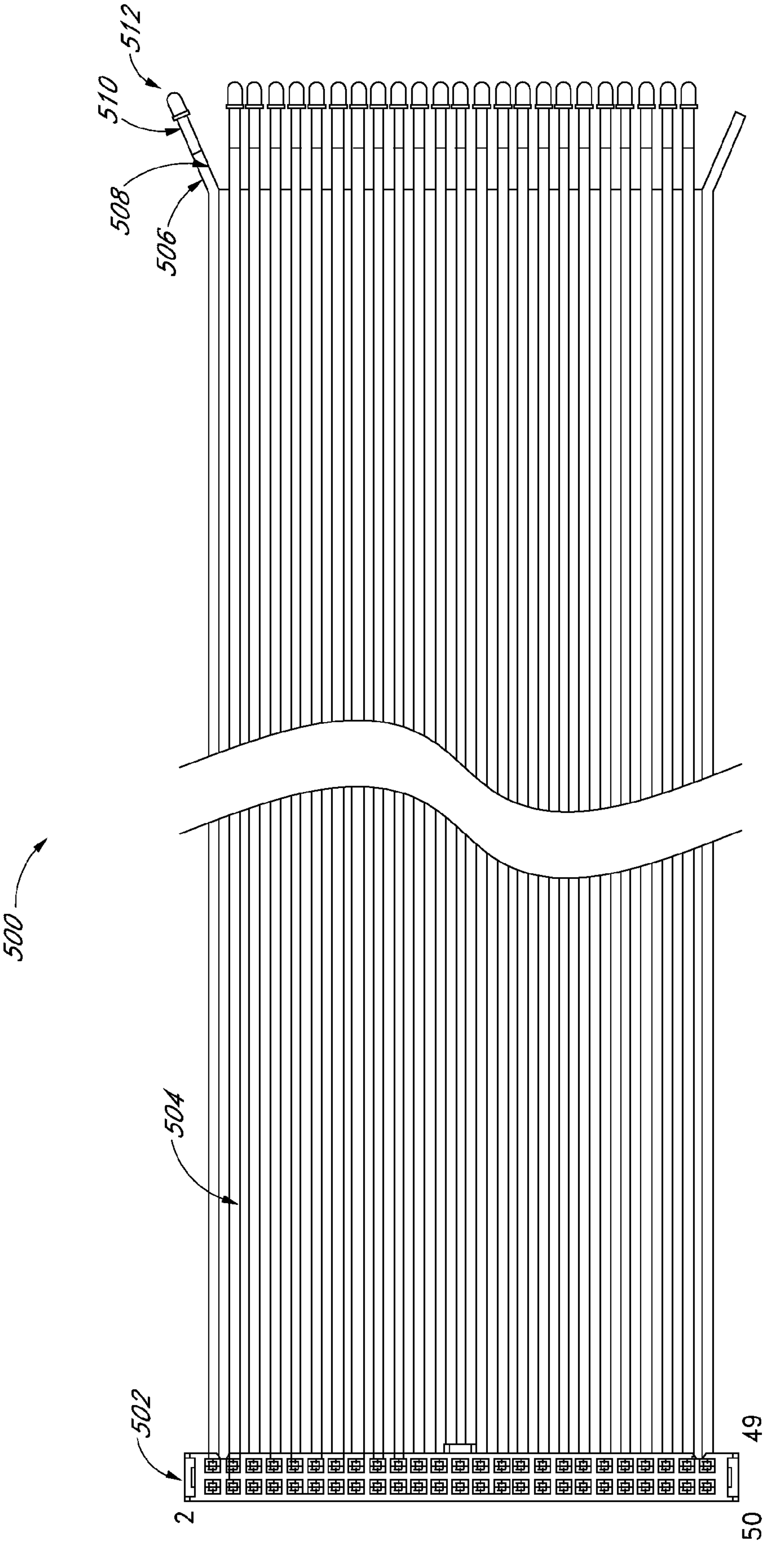
FIG. 17 is a top view of a portion of a light output unit with LEDs and an IDC cable according to one embodiment of the present invention.

FIG. 17 is a schematic top view of a portion of a light output unit 500 comprising a plurality of LEDs 512, IDC ribbon cable 504, and a controller connector 502 according to one embodiment of the present invention. One embodiment of the light output unit 500, such as is illustrated in FIG. 17, is similar to the light output units 31, 84, 94, and 104 in FIGS. 2-7 described above. As illustrated, this embodiment of the light output unit 500 comprises twenty-four LEDs 512, each LED 512 having two leads (not illustrated), each of which are electrically connected to a wire 506 or wire 508. The LED leads can be soldered to the wires 506 and 508. The interface between the LED and the wires 506 and 508 may be covered by a heat shrink tube 510 to protect the leads and prevent exposure of the conductive leads, solder, or internal wire. Each wire 506 and 508 may be heat sealed with an LED lead, and additional layers or heat seals may be placed over the contiguous pair of wires 506 and 508 and the sealed LED leads to provide structural stability to the light output unit 500 and provide better resistance to corrosion by sealing the components from environmental elements. The IDC ribbon cable 504 can be purchased off the shelf in a configuration with the multiple wires longitudinally attached to each other in a parallel array. The wires comprise an elongate conductive material housed in an insulating material, such as a metal housed in a plastic material. As illustrated, the IDC ribbon cable 504 has 50 parallel wires capable of being laid flat in a plane. Each of the wires can be mechanically or manually stripped or separated from the other wires. Some wires or sets of wires can be pre-stripped or partially stripped. Adjacent pairs of wires, such as wires 506 and 508 may be connected to each other and partially or completely separated from the rest of the wires in the ribbon cable. One of the advantages of using IDC ribbon cable is its relatively low cost and labor savings. For example, the snap fit of an IDC interface with the ribbon wire can save significant costs over soldering the plurality of wires to an interface. The ribbon cable can be provided in any number of lengths, and the lengths of the individual or paired wires can be made arbitrarily adjustable. Note that as illustrated, a 50-pin connector supplying two pins per LED where 24 LEDs are used results in a pair of pins being available because only 48 pins are needed to drive 24 LEDs. The illustrated embodiment of the controller connector 502 is an insulation-displacement connector, or insulation piecing connector (IDC)—specifically a 50-pin IDC, as is known in the art.

In a manner similar to an embodiment described above, in certain embodiments, the LEDs 512, IDC ribbon cable 504, the controller connector 502, any interface between parts, or any portion of these components may be made more resistant to corrosion or other forms of environmental damage by dipping parts of the components or assembled light output unit 500 in a waterproof or water resistant material or compound. For example, after an LED is soldered to wires, the assembly may be dipped in a liquid or gel material, such as potting compound, wax, a coating, sealant, acrylic sealant, nail polish, or fishing rod coatings or sealants (such as B.D. Classic rod coat or epoxy), that can form a water-resistant barrier once it cures. The water-resistant compound can be transparent or colored to create different lighting effects or to help obscure the wires from being easily seen.

Figure 18:
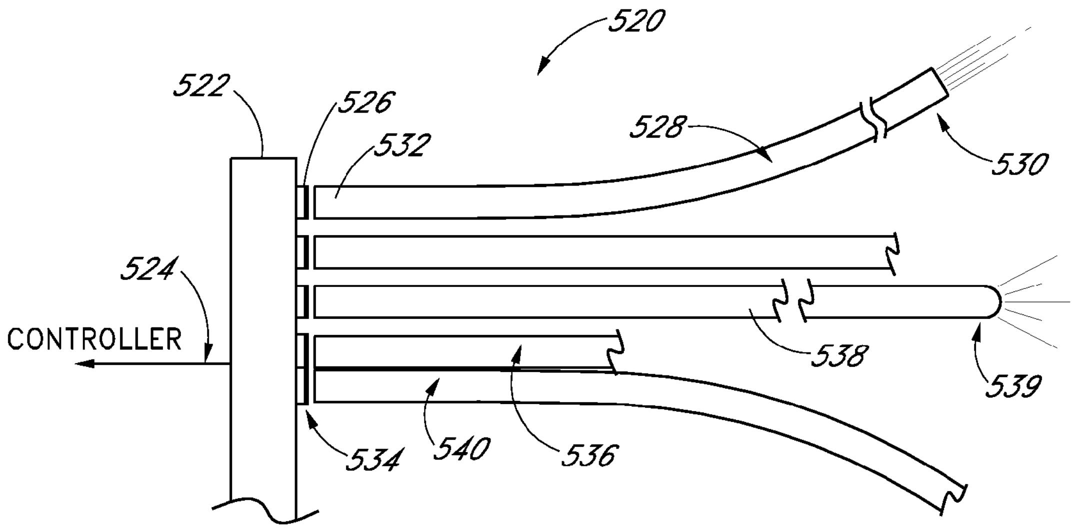
FIG. 18 is a schematic side view of a portion of a light output unit with fiber optics of one or more configurations according to one embodiment of the present invention.

FIG. 18 is a schematic side view of a portion of a light output unit 520 with light transmission tubes 528, 538, 536 or 540 of one or more configurations according to one embodiment of the present invention. In one embodiment, the light output unit 520 comprises one or more light transmission tubes 528 and a light output interface 522 electrically connected to a controller circuit 524. The controller circuit 524 can be any of the embodiments of a controller circuit described herein, including the controller circuit 300 of FIG. 10. In one embodiment, the light output interface 522 is comprised of one or more light sources 526. In various embodiments, the light source 526 is a light bulb, a LED, a surface mount device (SMD) illumination device, a surface mount technology (SMT) illumination device, or other lighting device which can be configured to emit light at specific frequencies or wavelengths or specific ranges of frequencies or wavelengths. In one embodiment, the light transmission tube 528 is a fiber optic cable with a proximal end 532 and a distal end 530, where the proximal end 532 of the fiber optic cable is adapted to absorb light emissions from the light source 526 and transmit that illumination to the distal end 530 of the fiber optic cable. Fiber optic cables can be provided with varying rigidity, flexibility, cross-section shape, width, depth, length, diameter, colors, color transmission characteristics, and configurations as is known in the art. Some fiber optics are configured to substantially only transmit light axially such that substantially no light emissions are detectable along the body of the fiber optic and only the distal end 530 emits light, such as with jacketed fiber optics or other translucent or opaque fiber optic cables. In one preferred embodiment, end-lit fiber optic cables are used to transmit light to a point at the distal end 530 of the light transmission tube so as to simulate a point of light instead of a tube or line of light.

In one embodiment, the light transmission tube 538 is a fiber optic cable with a distal end 539 that has been polished or finished to emit light at a wider angle of dispersion than a flat cut distal end fiber optic. Alternatively, the fiber optic cable can be injection molded with finishing and polishing to disperse light at a wider angle than substantially flat end-lit fiber optic cables with flat end surfaces perpendicular to the longitudinal axis of the fiber optic cable.

In one embodiment, more than one light transmission tube 536 and 540 may be configured to transmit light from a single light source 534. A light source 534 may be configured to illuminate one, two, three, four or more light transmission tubes.

Figure 19:
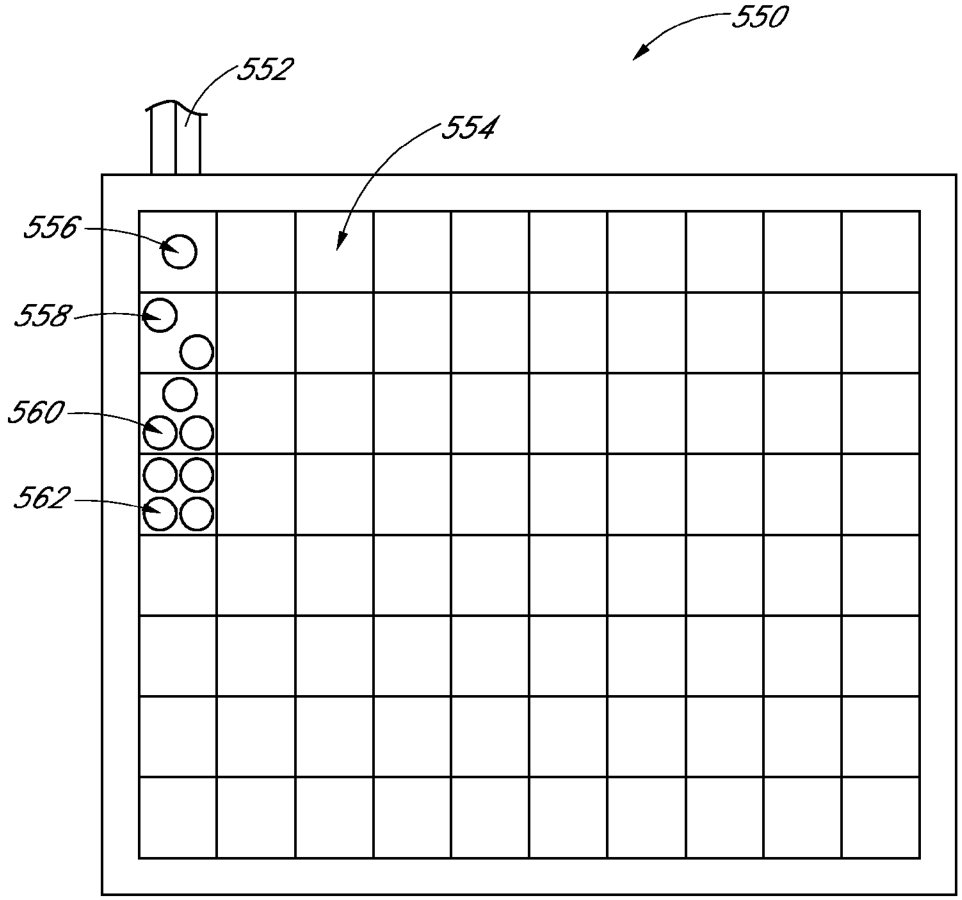
FIG. 19 is a schematic top view of a portion of a light output unit with various configurations for placing a light output bodies in proximity to a grid or array of light sources disposed on a surface mount device according to one embodiment of the present invention.

FIG. 19 is a schematic top view of a portion of a light output unit 550 with various configurations for placing light output bodies 556, 558, 560 and 562 in proximity to a grid or array of light sources 544 according to one embodiment of the present invention. The light output unit 550 is electrically connected to a control circuit 552 which may be any of the embodiments of a controller circuit described herein, including the controller circuit 300 of FIG. 10. In one embodiment, the light output unit 550 is comprised of one or more light sources 526 arranged in an array, grid or matrix. In various embodiments, the light source 526 is a light bulb, a LED, a surface mount device (SMD) illumination device, a surface mount technology (SMT) illumination device, or other lighting device which can be configured to emit light at specific frequencies or wavelengths or specific ranges of frequencies or wavelengths. As illustrated, the embodiment of the light source 526 is a SMT light emitter which is configured to illuminate one, two, three, four or more light output bodies 556, 558, 560 and 562. As illustrated, the light output bodies 556, 558, 560 and 562 are substantially similarly sized circular cross-section elongate members. However, the cross sectional shape and size of the light output bodies 556, 558, 560 and 562 can be any shape or size, such as squares, rectangles, triangles, or other shapes.

FIGS. 20-25 illustrate various light output units with light output covers which can be used to modify light and to provide decorative or ornamental effects. The light output covers, or lenses, or beads, are attachable to the distal end of a light tube, LED, fiber optic cable, or any light emitter to modify the angle, color, or visual effect of the light being emitted by the light emitter. Some embodiments of light emitters can be customized or configured with desired light, color, viewing angles, and other characteristics designed into them. However, other embodiments, as described herein can be modified with light output covers. In some embodiments, the light output covers are configured to disperse the light from a relatively narrow viewable range from the axis of the light emitter to a relatively broader angle of light visibility. The light output covers may be attached to a light emitter or an elongate transmission member by an adhesive bond, mechanical fit, snap interface, threaded interface, friction fit, or other means of mechanically connecting two bodies. The light output covers may be provided in any color and may be translucent, opaque, or both.

Figure 20:
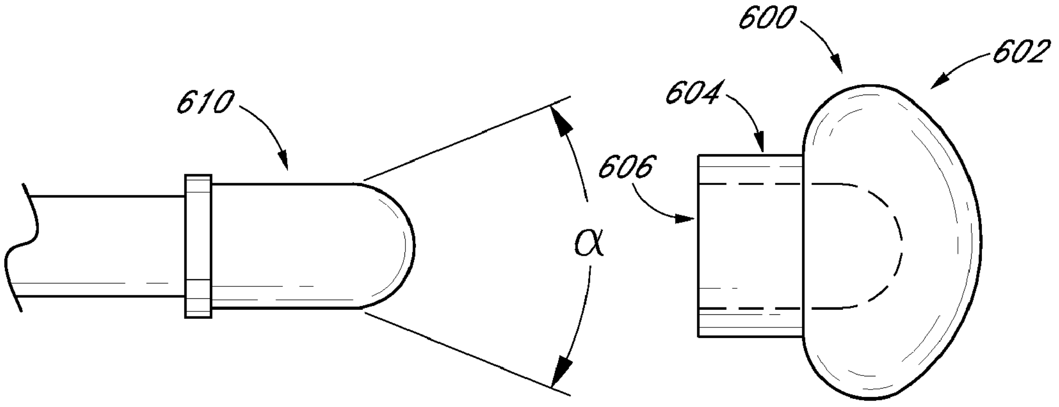
FIG. 20 is an exploded schematic side view of a light output unit with a light output cover according to one embodiment of the present invention.

FIG. 20 is an exploded schematic side view of a light output unit 610 with a light output cover 600 according to one embodiment of the present invention. In one embodiment the light output unit 610 is a LED, many of which tend to have a relatively narrow viewing angle. In order to see the light, many LEDs require a viewer to view the LED within an angle alpha ($\alpha$) in order to see a sufficiently bright light. In some instances, the LED may have a 25-110 degree viewing angle. However, in adding the light output cover 600, which has a distal end 602, a proximal end 604 and a light emitter interface 606, the angle for viewing a light may be increased to a viewing angle of 180-360 degrees.

Figure 21:
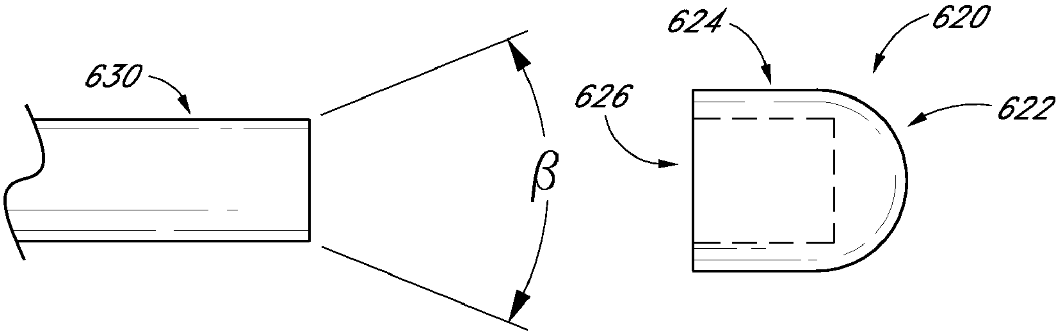
FIG. 21 is an exploded schematic side view of a light output unit with a light output cover according to another embodiment of the present invention.

FIG. 21 is an exploded schematic side view of a light output unit 630 with a light output cover 620 according to another embodiment of the present invention. In one embodiment the light output unit 630 is a light transmission tube or a fiber optic cable, many of which tend to have a relatively narrow viewing angle. In order to see the light, many fiber optics require a viewer to view the distal end of the fiber optic cable within an angle beta ($\beta$) in order to see a sufficiently bright light. In some instances, the fiber optic cable may have a 5-15 degree viewing angle. However, in adding the light output cover 620, which has a distal end 622, a proximal end 624 and a light emitter interface 626, the angle for viewing a light may be increased to a viewing angle of 180-360 degrees.

Figure 22:
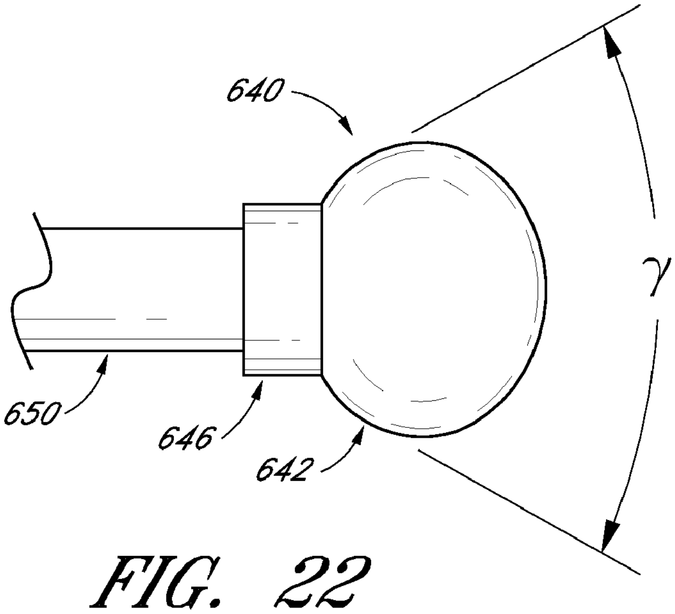
FIG. 22 is a schematic side view of a light output unit attached to a light output cover according to another embodiment of the present invention.

FIG. 22 is a schematic side view of a light output unit 650 attached to a light output cover 640 according to another embodiment of the present invention. The light output unit 650 may be any embodiment of light emitter or light transmission device described herein. The light output cover 640, which has a distal end 642, and a proximal end 646 changes the viewable angle of light transmission to an angle gamma ($\gamma$), where $\gamma$ can be changed to a viewing angle of between 90-360 degrees, with viewing angles of approximately 90 degrees, 120 degrees, 180 degrees, 240 degrees, 270 degrees, or 360 degrees.

Figure 23:
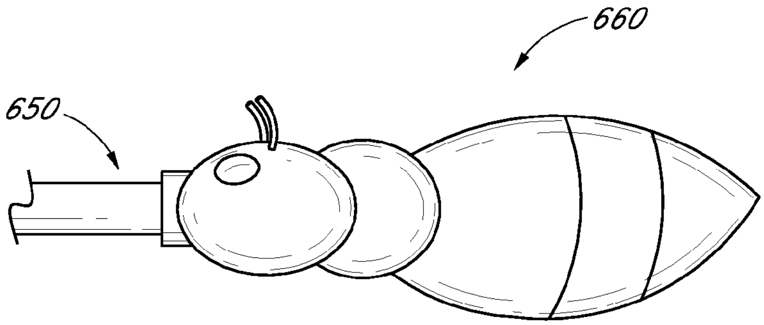
FIG. 23 is a schematic side view of a light output unit attached to a light output cover according to another embodiment of the present invention.
Figure 24:
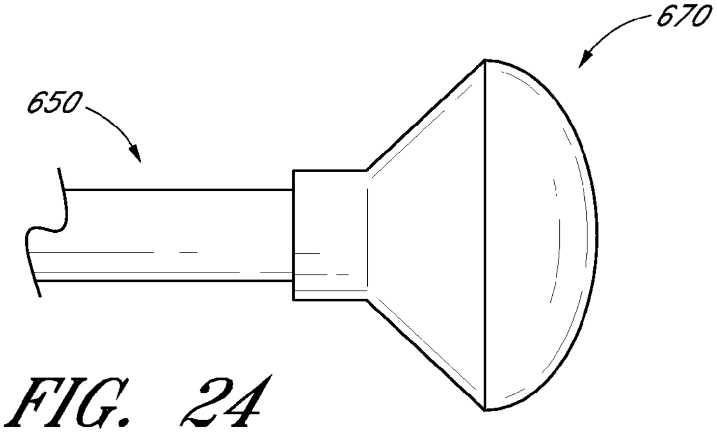
FIG. 24 is a schematic side view of a light output unit attached to a light output cover according to another embodiment of the present invention.
Figure 25:
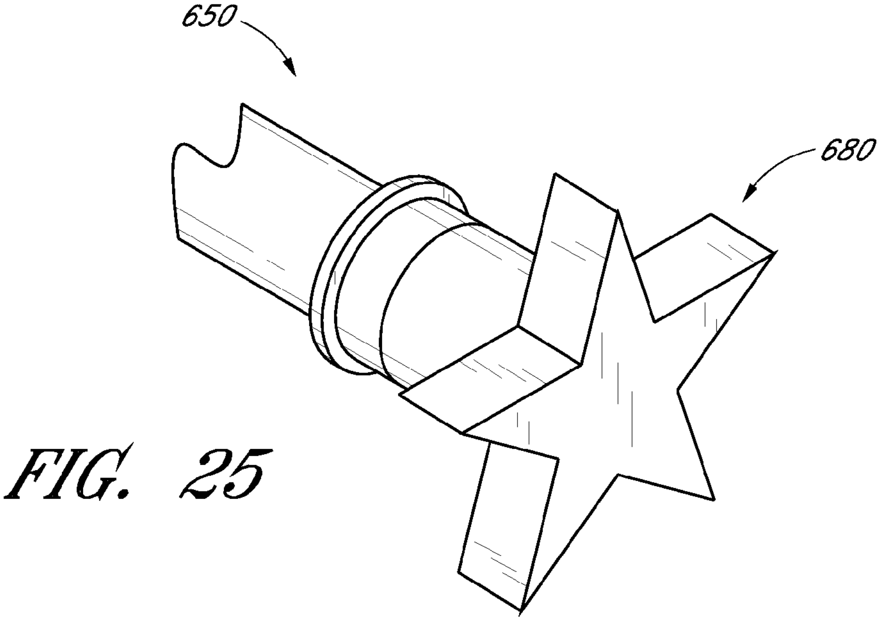
FIG. 25 is a schematic side view of a light output unit attached to a light output cover according to another embodiment of the present invention.

FIGS. 23-25 are schematic side views of the light output units 650 described relating to FIG. 22 which are attached to light output covers 660, 670 and 680, respectively, according to more embodiments of the present invention. The light output covers can be configured to appear ornamental or decorative while serving the function of modifying the light transmitted from the light output unit. For example, light output cover shapes may include insects, fireflies 660, cones, dew drops 670, stars 680, flowers, or other shapes.

It will be understood that the foregoing is only illustrative of the principles of the invention, and that various modifications, alterations, and combinations can be made by those skilled in the art without departing from the scope and spirit of the invention. Accordingly, it is not intended that the invention be limited, except as by the appended claims.

What is claimed is:

1. An improved lighting display system, comprising;

a power source;

an insulation-displacement connector which is electrically connectable to the power source;

an insulation-displacement connector cable which is electrically connected to the insulation-displacement connector, the insulation-displacement connector cable comprising a plurality of wires having a distal end;

at least one light emitter disposed at the distal end of each of the wires, the each of the light emitters being electrically connected to the insulation-displacement connector cable; and a controller circuit electrically connected to the power source and to the insulation-displacement connector, the controller circuit being configured to control a lighting pattern of the at least one light emitter;

wherein the lighting pattern ramps upward in brightness at a first upward ramp rate from a non-illuminated level to a maximum-brightness level in a first duration, and ramps downward in brightness at a first downward ramp rate from the maximum-brightness level to the non-illuminated level in a second duration.

2. The lighting display system of claim 1, wherein the lighting pattern further maintains a maximum-brightness level for a maximum-brightness level duration.

3. The lighting display system of claim 1, wherein the lighting pattern further comprises a change in downward ramp rate in brightness.

4. The lighting display system of claim 1, wherein the lighting pattern further comprises a change in upward rate of increasing brightness.

5. The lighting display system of claim 1, wherein the lighting pattern further comprises an increase in brightness at a second upward ramp rate and changes brightness at a second downward ramp rate.

6. The lighting display system of claim 1, wherein the lighting pattern is repeated three times followed by a randomly determined duration of non-illumination followed by a second lighting pattern.

7. The lighting display system of claim 1, wherein the lighting pattern flutters for a first fluttering duration and flutters for a second fluttering duration.

8. The lighting display system of claim 7, wherein the lighting pattern is repeated three times followed by a randomly determined duration of non-illumination followed by a second lighting pattern.

9. An improved lighting display system, comprising;

a power source;

a controller circuit electrically connected to the power source;

at least one elongate transmission member with a proximal end and a distal end, wherein the proximal end is electrically connected to the controller circuit; and at least one light emitter which is electrically connected to the distal end of the elongate transmission member, the at least one light emitter being configured to illuminate in a lighting pattern;

wherein the lighting pattern is controlled by the controller circuit so that the lighting pattern varies in brightness over time, the lighting pattern varying in brightness at one or more pre-determined rates for one or more durations.

10. The lighting display system of claim 9, wherein the at least one elongate transmission member comprises a fiber optic cable.

11. The lighting display system of claim 9, wherein the at least one light emitter comprises a LED.

12. The lighting display system of claim 9, wherein the at least one elongate transmission member comprises an insulation-displacement connector cable.

13. The lighting display system of claim 12, further comprising an insulation-displacement connector connected to the proximal end of the insulation-displacement connector cable, the insulation-displacement connector being electrically connected to the controller.

14. The lighting display system of claim 9, wherein the power source comprises a rechargeable battery.

15. The lighting display system of claim 9, wherein the power source comprises a solar panel.

16. The lighting display system of claim 9, wherein the lighting pattern ramps upward in brightness from a non-illuminated level to a maximum-brightness level at an upward rate in a first duration, maintains a maximum-brightness level for a second duration, and ramps downward in brightness at a downward rate from the maximum-brightness level to the non-illuminated level in a third duration.

17. The lighting display system of claim 16, wherein the first duration is substantially instantaneous, the second duration is approximately 0.5 seconds, and the third duration is approximately 1.8-2.0 seconds.

18. The lighting display system of claim 9, wherein the lighting pattern ramps upward in brightness from a non-illuminated level to a maximum-brightness level at a first rate in a first duration, ramps downward in brightness at a second rate for a second duration, changes downward ramp rate in brightness at a third rate to return to the non-illuminated level in a third duration, ramps upward in brightness from the non-illuminated level to the maximum-brightness level at the first rate in the first duration, ramps downward in brightness at the second rate for the second duration, changes downward ramp rate in brightness at the third rate to return to the non-illuminated level in the third duration, increases in brightness at a fourth rate to a first portion of the maximum-brightness level within a fourth duration, ramps downward in brightness at a fifth rate for a fifth duration, changes downward brightness at a sixth rate to return in a sixth duration to the non-illuminated level.

19. The lighting display system of claim 18, wherein the first duration is less than 0.2 seconds, the second duration is approximately 0.1-0.15 seconds, the third duration is approximately 0.8 seconds, the first portion of the maximum-brightness level is approximately 50%-70% of the maximum-brightness level, the fourth duration is approximately 0.1 seconds, the fifth duration is approximately 1.6 seconds, and the fifth duration is approximately 2.5 seconds.

20. The lighting display system of claim 9, wherein the lighting pattern ramps upward in brightness from a non-illuminated level at a first rate for a first duration, changes to a second rate of increasing brightness for a second duration to reach a maximum-brightness level, and ramps downward in brightness to the non-illuminated level at a third rate in a third duration.

21. The lighting display system of claim 20, wherein the first duration is approximately 1.5 seconds, the second duration is 2.5-2.8 seconds, and the third duration is approximately 0.1 seconds.

22. The lighting display system of claim 9, wherein the lighting pattern ramps upward in brightness at a first upward ramp rate from a non-illuminated level for a first duration, increases in brightness at a second upward ramp rate for a second duration to achieve a maximum-brightness level, ramps downward at a first downward ramp rate for a third duration, and changes brightness at a second downward ramp rate to the non-illuminated brightness level in a fourth duration.

23. The lighting display system of claim 22, wherein the first duration is approximately 1.5 seconds, the second duration is approximately 0.7-0.8 seconds, the third duration is approximately 2.4-2.6 seconds, and the fourth duration is approximately 0.8 seconds.

24. The lighting display system of claim 9, wherein the lighting pattern ramps upward in brightness at a first upward ramp rate from a non-illuminated level to a maximum-brightness level in a first duration, and ramps downward in brightness at a first downward ramp rate from the maximum-brightness level to the non-illuminated level in a second duration.

25. The lighting display system of claim 24, wherein the lighting pattern is repeated three times followed by a randomly determined duration of non-illumination followed by a second lighting pattern.

26. The lighting display system of claim 9, wherein the lighting pattern flutters.

27. The lighting display system of claim 26, wherein the lighting pattern flutters for a first fluttering duration, ramps upward in brightness at a first upward ramp rate from a non-illuminated level to a maximum-brightness level for a upward duration, ramps downward in brightness at a first downward ramp rate from the maximum-brightness level to the non-illuminated level in a downward duration, and flutters for a second fluttering duration.

28. The lighting display system of claim 27, wherein the lighting pattern is repeated three times followed by a randomly determined duration of non-illumination followed by a second lighting pattern.

29. An improved lighting display system, comprising;

a power source comprising a rechargeable battery electrically connected to a solar panel;

a controller circuit electrically connected to the power source, the controller circuit comprising at least one microcontroller unit;

an insulation-displacement connector cable which is electrically connected to the controller circuit, the insulation-displacement connector cable having a distal end; and at least one LED which is electrically connected to the distal end of the insulation-displacement connector cable, the LED being configured to illuminate in at least one lighting pattern controlled by the controller circuit, wherein the at least one lighting pattern ramps upward in brightness at a first upward ramp rate from a non-illuminated level to a maximum-brightness level in a first duration, ramps downward in brightness at a first downward ramp rate from the maximum-brightness level to the non-illuminated level in a second duration followed by a randomly determined duration of non-illumination followed by a second lighting pattern.

30. A method of illuminating a light with a lighting display system, the method comprising;

providing an improved lighting display system comprising;

a power source;

a controller circuit electrically connected to the power source;

at least one elongate transmission member with a proximal end and a distal end, wherein the proximal end is electrically connected to the controller circuit; and at least one light emitter which is electrically connected to the distal end of the elongate transmission member, the at least one light emitter being configured to illuminate in a lighting pattern; and programming the controller circuit to direct an average current to vary the lighting pattern brightness of the at least one light emitter over time, wherein the at least one light emitter will ramp up in brightness at a pre-determined finite rate.

* * * * *